US012586649B2

(12) United States Patent
Kosako et al.

(10) Patent No.:  US 12,586,649 B2
(45) Date of Patent:  Mar. 24, 2026

(54) STORAGE DEVICE WITH WORD LINES APPLIED WITH RESPECTIVE VOLTAGE LEVELS DURING DIFFERENT TIME PERIODS

(71) Applicant: Kioxia Corporation, Tokyo (JP)

(72) Inventors: Hiroaki Kosako, Yokkaichi Mie (JP); Kota Nishikawa, Zama Kanagawa (JP); Kenrou Kikuchi, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 216 days.

(21) Appl. No.: 18/459,745

(22) Filed: Sep. 1, 2023

(65) Prior Publication Data

US 2024/0096422 A1      Mar. 21, 2024

(30) Foreign Application Priority Data

Sep. 20, 2022    (JP) ................................. 2022-149194

(51) Int. Cl.
*G11C 16/16*          (2006.01)
*G11C 16/04*          (2006.01)
*G11C 16/34*          (2006.01)

(52) U.S. Cl.
CPC .......... *G11C 16/16* (2013.01); *G11C 16/0483* (2013.01); *G11C 16/3445* (2013.01)

(58) Field of Classification Search
CPC . G11C 16/16; G11C 16/0483; G11C 16/3445; G11C 16/32; G11C 16/08
See application file for complete search history.

(56) References Cited

U.S. PATENT DOCUMENTS

| | | | | |
|---|---|---|---|---|
| 6,987,694 B2 * | 1/2006 | Lee | .................... | G11C 16/0483 |
| | | | | 365/185.23 |
| 11,386,959 B2 * | 7/2022 | Takekida | ........... | G11C 16/0483 |
| 11,437,110 B1 * | 9/2022 | Wu | ........................ | H10B 41/35 |
| 2006/0279999 A1 | 12/2006 | Byeon et al. | | |
| 2016/0064088 A1 | 3/2016 | Shiga et al. | | |

FOREIGN PATENT DOCUMENTS

| | | |
|---|---|---|
| JP | 2006-351168 A | 12/2006 |
| JP | 2016-051485 A | 4/2016 |
| JP | 6199835 B2 | 9/2017 |

* cited by examiner

*Primary Examiner* — Douglas King
*Assistant Examiner* — Christopher Lane Reece
(74) *Attorney, Agent, or Firm* — Foley & Lardner LLP

(57)          ABSTRACT

A first select transistor is connected to a first wiring. A first memory cell transistor and a second memory cell transistor are connected in series between the first select transistor and a second select transistor. A first word line is connected to the first memory cell transistor. A second word line is connected to the second memory cell transistor. During a first period in which the first voltage is applied to the first wiring, a second voltage lower than a first voltage is applied in parallel to the first word line and the second word line. During a second period in which a third voltage higher than the first voltage is applied to the first wiring, the second voltage is applied to the first word line, and a fourth voltage higher than the second voltage and lower than the third voltage is applied to the second word line. During a third period in which the third voltage is applied to the first wiring, the fourth voltage is applied to the first word line, and the second voltage is applied to the second word line.

16 Claims, 16 Drawing Sheets

10

26(BL)
27
50
51
53
54
55
DT
36
25
MP
24(SGDL)
35
MT_n-1
23(WL_n-1)
34
MT_n-2
23(WL_n-2)
34
MT_n-3
23(WL_n-3)
23(WL_4)
34
MT_3
23(WL_3)
34
MT_2
23(WL_2)
34
MT_1
23(WL_1)
34
MT_0
23(WL_0)
34
ST
22(SGSL)
33
21 z
x ⊗ → y

FIG. 6

STORAGE DEVICE WITH WORD LINES APPLIED WITH RESPECTIVE VOLTAGE LEVELS DURING DIFFERENT TIME PERIODS

CROSS-REFERENCE TO RELATED APPLICATION

This application is based upon and claims the benefit of priority from Japanese Patent Application No. 2022-149194, filed Sep. 20, 2022, the entire contents of which are incorporated herein by reference.

FIELD

Embodiments described herein generally relate to a storage device.

BACKGROUND

A storage device in which memory cells are located three-dimensionally is known. Storage devices are required to have higher data retention characteristics and shorter operating times.

DESCRIPTION OF THE DRAWINGS

FIG. 6 is a diagram illustrating an example of drivers and row decoders of the storage device according to the first embodiment, and related functional blocks;

DETAILED DESCRIPTION

Figure 1:
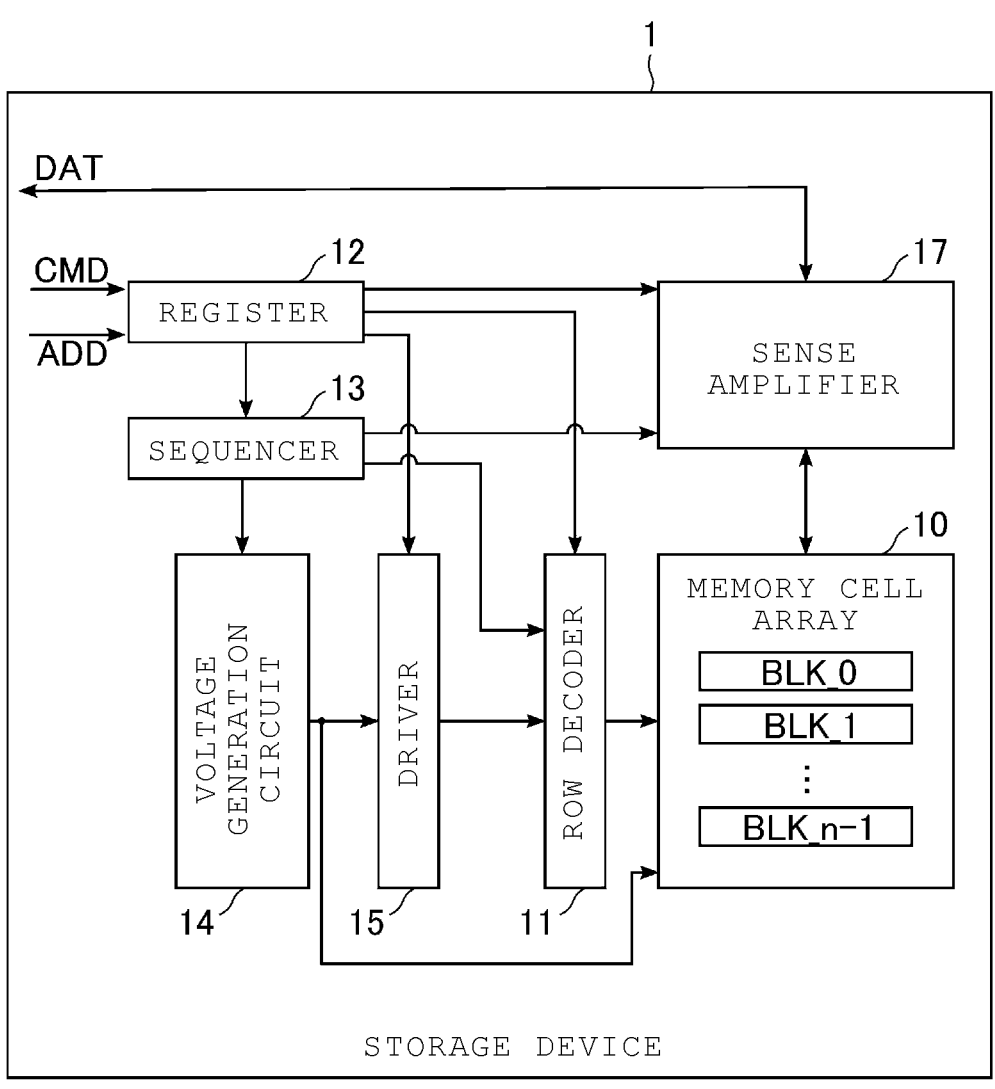
FIG. 1 is a diagram illustrating an example of components of a storage device according to a first embodiment and connection of the components.

Embodiments are to provide a storage device with high data retention characteristics.

The storage device according to at least one embodiment includes a first wiring, a first select transistor, a second select transistor, a first memory cell transistor, a second memory cell transistor, a first word line, and a second word line.

The first select transistor is connected to the first wiring. The first memory cell transistor and the second memory cell transistor are connected in series between the first select transistor and a second select transistor. The first word line is connected to the first memory cell transistor. The second word line is connected to the second memory cell transistor. During the first period in which a first voltage is applied to the first wiring, a second voltage lower than the first voltage is applied in parallel to the first word line and the second word line. During the second period in which a third voltage higher than the first voltage is applied to the first wiring, the second voltage is applied to the first word line, and a fourth voltage higher than the second voltage and lower than the third voltage is applied to the second word line. During the third period in which the third voltage is applied to the first wiring, the fourth voltage is applied to the first word line, and the second voltage is applied to the second word line.

Embodiments are described below with reference to the drawings. In some cases, the plurality of components having substantially the same functions and configurations in one embodiment, different embodiments, and different Modified Example may be distinguished from each other by adding additional numbers or letters to the ends of the reference numerals. The description following some description mainly describes points different from those already described. Thus, all descriptions made about a certain embodiment also apply as descriptions made to another embodiment, unless expressly or explicitly excluded.

As used herein and in the claims, when a first element is "connected" to another second element, it denotes that the first element is connected to the second element either directly or permanently or selectively via a conductive element.

An xyz orthogonal coordinate system is used for the following description. In the following description, the description "lower" and its derivatives and related terms refer to the position of the smaller coordinate than the position on the z-axis, and the description "upper" and its derivatives and related terms refer to the position of the larger coordinate than the position on the z-axis.

1. First Embodiment

1.1. Configuration (Structure)

FIG. 1 illustrates an example of components of a storage device according to a first embodiment and connection of the components. A storage device 1 is a device storing data by using memory cells. The storage device 1 is controlled by an external memory controller. The storage device 1 operates, for example, based on commands CMD and address information ADD received from the memory controller. The storage device 1 receives data DAT to be written and outputs data stored in the storage device 1. The storage device 1 is configured, for example, as one semiconductor chip.

The storage device 1 includes components such as a memory cell array 10, a row decoder 11, a register 12, a sequencer 13, a voltage generation circuit 14, a driver 15, and a sense amplifier 17.

The memory cell array 10 is a set of the located memory cells. The memory cell array 10 includes a plurality of memory blocks BLK. Each block BLK includes a plurality of memory cell transistors MT (not illustrated). Wirings of word lines WL (not illustrated), bit lines BL (not illustrated), and the like are also located in the memory cell array 10.

The row decoder 11 is a circuit for selecting the block BLK. The row decoder 11 transfers the voltage supplied from driver 15 to one block BLK selected based on a block address received from the register 12.

The register 12 is a circuit retaining the command CMD and the address information ADD received by the storage device 1. The command CMD instructs the sequencer 13 to perform various operations including data read, data write, and data erasing. Address information ADD designates the access target in the memory cell array 10.

The sequencer 13 is a circuit controlling operations of the entire storage device 1. The sequencer 13 controls the row decoder 11, the driver 15, and the sense amplifier 17 based on the command CMD received from the register 12 to perform various operations including the data read, the data write, and the data erasing.

The voltage generation circuit 14 is a circuit generating a plurality of voltages having different magnitudes. The voltage generation circuit 14 receives a power supply voltage from an outside of the storage device 1 and generates a plurality of voltages from the power supply voltage. The voltage generation circuit 14 supplies the generated voltage to components such as the memory cell array 10 and the driver 15.

The driver 15 is a circuit applying various voltages required for the operation of the storage device 1 to some components. The driver 15 receives a plurality of voltages from the voltage generation circuit 14 and supplies selected ones of the plurality of voltages to the one or more row decoders 11.

The sense amplifier 17 is a circuit outputting a signal based on the data stored in the memory cell array 10. The sense amplifier 17 senses a state of the memory cell transistor MT and generates read data based on the sensed state. The sense amplifier 17 applies the voltage based on write data to the bit line BL.

1.1.2. Memory Cell Array

Figure 2:
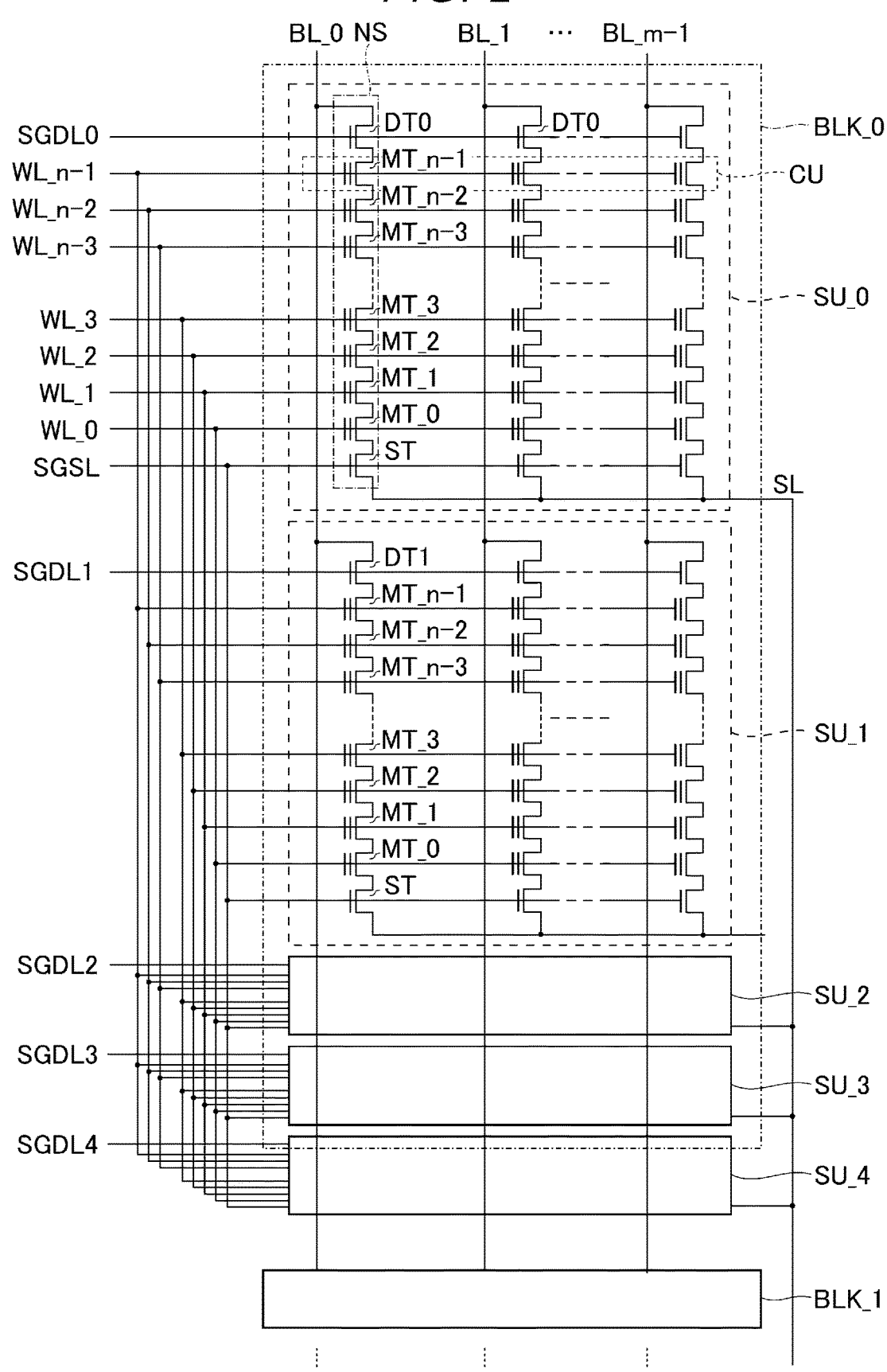
FIG. 2 is a diagram illustrating components of one block of the storage device according to the first embodiment and connection of the components.

FIG. 2 illustrates components of one block BLK of the storage device according to the first embodiment and connection of the components. The plurality of block BLKs, for example, all the block BLKs, include the components and the connections illustrated in FIG. 2.

One block BLK includes a plurality of string units SU. FIG. 2 illustrates an example of five string units SU_0 to SU_4.

As illustrated in FIG. 2, each of m bit lines BL_0 to BL_m−1 is connected to one NAND string NS from each of the string units SU_0 to SU_4 in each block BLK. m is a positive integer.

Each NAND string NS includes one select gate transistor ST, n memory cell transistors MT (MT_0 to MT_n−1), and one select gate transistor DT (DT0, DT1, DT2, DT3, or DT4). n is a positive integer and an even number. The memory cell transistor MT is an element storing data in a non-volatile manner. The memory cell transistor MT includes a control gate electrode or a gate electrode (word line WL) and a charge storage film insulated from periphery, and stores data based on charges in the charge storage film in a non-volatile manner. Data is written into the memory cell transistor MT by injecting electrons into the charge storage film.

The select gate transistor ST, the memory cell transistors MT_0 to MT_n−1, and the select gate transistor DT are connected in series between source line SL and one bit line BL in this order.

The plurality of NAND strings NS connected to the plurality of different bit lines BL constitute one string unit SU. In each string unit SU, the control gate electrodes of the memory cell transistors MT_0 to MT_n−1 are connected to word lines WL_0 to WL_n−1, respectively. A set of the memory cell transistors MT sharing the word line WL in one string unit SU is referred to as a cell unit CU.

The select gate transistors DT0 to DT4 belong to the string units SU_0 to SU_4, respectively. In FIG. 2, the select gate transistors DT2, DT3, and DT4 are omitted. The gate of the select gate transistor DT0 of each of the plurality of NAND strings NS of the string unit SU_0 is connected to a select gate line SGDL0. Similarly, the gates of the select gate transistors DT1, DT2, DT3, and DT4 of each of the plurality of NAND strings NS of each of string units SU 1, SU 2, SU 3, and SU_4 are connected to select gate lines SGDL1, SGDL2, SGDL3, and SGDL4.

The gate of the select gate transistor ST is connected to a select gate line SGSL.

Each block BLK may have any structure as long as the circuit illustrated in FIG. 2 is implemented. As an example, each block BLK may have a structure illustrated in FIG. 3.

Figure 3:
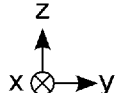
FIG. 3 is a diagram illustrating a structure of a cross section along a yz plane of a portion of a memory cell array of the storage device according to the first embodiment.

FIG. 3 illustrates a cross-sectional structure along a yz plane of a portion of the memory cell array of the storage device according to the first embodiment. As illustrated in FIG. 3, the memory cell array 10 includes a semiconductor 21, a conductor 22, eight conductors 23, conductors 24 and 27, insulators 33 to 36, and a memory pillar MP. The insulators 33 to 36 contain or are made of, for example, silicon oxide.

The semiconductor 21 extends along an xy plane and has a plate-like shape. The semiconductor 21 functions as at least a portion of the source line SL. The semiconductor 21 contains, for example, phosphorus-doped silicon or is made of phosphorus-doped silicon and has an n-type conductivity.

The insulator 33 is located on an upper surface of the semiconductor 21.

The conductor 22 is located on the upper surface of the insulator 33. The conductor 22 extends along the xy plane and has the plate-like shape. The conductor 22 functions as at least a portion of the select gate line SGSL. The conductor 22 contains or is made of, for example, tungsten.

The plurality of insulators 34 and the plurality of conductors 23 are located alternately one by one on the upper surface of the conductor 22 along the z-axis. Therefore, the conductors 23 are aligned to be spaced apart along the z-axis at intervals. The insulator 34 and the conductor 23 extend along the xy plane and have a plate-like shape. The plurality of conductors 23 function as at least a portion of the word lines WL_0 to WL_n−1 in order from the semiconductor 21 side. The conductor 23 contains or is made of, for example, tungsten.

The insulator 35 is located on the upper surface of the uppermost conductor 23.

The conductor 24 is located on the upper surface of the insulator 35. The conductor 24 functions as at least a portion of one of select gate lines SGDL_0 to SGDL_4. The conductor 24 contains or is made of tungsten.

The insulator 36 is located on the upper surface of conductor 24.

The conductor 26 is located on the upper surface of the insulator 36. The conductor 26 has a linear shape and extends along the y-axis. The conductor 26 functions as at least a portion of one bit line BL. The conductors 26 are also provided in the yz-plane, which is different from the yz-plane illustrated in FIG. 3, and thus, the conductors 26 are aligned to be spaced apart along the x-axis at intervals. The conductor 26 contains or is made of, for example, copper.

The memory pillar MP extends along the z-axis and has a pillar shape. The memory pillar MP is located in a stacked structure made of the insulators 33 to 36 and the conductors 22 to 24, and penetrates or passes through the insulators 33 to 36 and the conductors 22 to 24. The upper surface of the memory pillar MP is located above the uppermost conductor 24. The lower surface of the memory pillar MP is in contact with the semiconductor 21. The portion where the memory pillar MP and the conductor 22 are in contact functions as a select gate transistor ST. The portion where the memory pillar MP and one conductor 23 are in contact functions as one memory cell transistor MT. The portion where the memory pillar MP and the conductor 24 are in contact functions as one select gate transistor DT.

The memory pillar MP includes, for example, a core 50, a semiconductor 51, a tunnel insulator 53, a charge storage film 54, a block insulator 55, and a conductor 25. The core 50 extends along the z-axis and has a pillar shape. The core 50 is made of an insulator, and for example, contains or is made of silicon oxide.

The semiconductor 51 covers the front surface of the core 50. The semiconductor 51 is in contact with the semiconductor 21 on the lower surface. The semiconductor 51 functions as a channel (current path) of the memory cell transistor MT and the select gate transistors DT and ST. The semiconductor 51 contains or is made of, for example, silicon.

The tunnel insulator 53 surrounds the side surface of the semiconductor 51 and has a cylindrical shape. The tunnel insulator 53 contains or is made of, for example, silicon oxide.

The charge storage film 54 surrounds the side surface of the tunnel insulator 53 and has a cylindrical shape. The charge storage film 54 contains or is made of, for example, silicon nitride.

The block insulator 55 surrounds the side surface of the charge storage film 54 and has a cylindrical shape. The side surface of the block insulator 55 is surrounded by the conductors 23. The block insulator 55 contains or is made of, for example, silicon oxide.

The structure of the memory pillar MP is not limited to the example illustrated in FIG. 3. For example, the portion including a bottom surface of the memory pillar MP may be located in the semiconductor 21. In addition, a set of the tunnel insulator 53, the charge storage film 54, and the charge storage film 54 may be partially opened in the side surface of the semiconductor 21. The semiconductor 21 is in contact with the semiconductor 51 by placing the material of the semiconductor 21 in this opening.

The conductor 25 is located on the upper surfaces of the core 50 and the semiconductor 51. The conductor 25 contains, for example, phosphorus-doped silicon or is made of phosphorus-doped silicon.

One memory pillar MP and one conductor 25 are connected by the conductor 27.

The periphery of the structure illustrated in FIG. 3 can have any structure. For example, the semiconductor 21 is located above the semiconductor substrate, and circuits such as the row decoder 11, the driver 15, and/or the sense amplifier 17 are formed in the region including the upper surface of the substrate. The circuits may be provided below the memory pillars MP described later on the upper surface of the substrate, and may be provided in the region other than below the region in which the memory pillars MP are provided on the upper surface of the substrate.

The storage device 1 may include, above the substrate, an upper side structure in which the structure illustrated in FIG. 3 is inverted along the xy plane. That is, the storage device 1 includes the substrate and a lower side structure formed in the region including the upper surface of the substrate and including circuits. The structure illustrated in FIG. 3 is formed on another substrate, and a structure, in which the formed structure is reversed with respect to the xy plane, is bonded to the lower side structure as the upper side structure. After that, the substrate used to form the upper side structure is removed.

The memory cell array 10 has a configuration capable of supplying holes to the semiconductor 51. As long as holes can be supplied, the configuration may be freely selected. An example is described below. The semiconductor 51 contains impurities as described below. The portion of the semiconductor 51 including the end on the semiconductor 21 side is doped with, for example, phosphorus as the impurity. By containing the phosphorus, the portion of the semiconductor 51 including the end on the semiconductor 21 side has an n-type conductivity. Other examples of doped impurities include arsenic.

For example, phosphorus is distributed as follows. That is, the portion of the semiconductor 51 from the interface (the lower surface of the semiconductor 51) with the semiconductor 21 to the center of the conductor 22 or a vicinity thereof contains phosphorus at a high concentration, for example, $1 \times 10^{19}$ atoms/cm$^3$ or more. The portion of semiconductor 51 above the center of conductor 22 contains a lower concentration of phosphorous. With such an impurity concentration distribution, the select gate transistor ST can generate a gate induced drain leakage (GIDL) current in the semiconductor 51. The GIDL current produces electron-hole pairs. When the generated holes enter the charge storage film 54, the holes can be recombined with the electrons taken into the charge storage film 54 by the data writing. Due to the recombination, negative charges disappear from the charge storage film 54. Due to the disappearance of the negative charge, the threshold voltage of the memory cell transistor MT is lowered. That is, the data stored in the memory cell transistor MT is erased.

In addition, the channel of the select gate transistor ST contains a low concentration of phosphorus on the upper side. Accordingly, the select gate transistor ST also functions as a switch controlling connection and disconnection between the source line SL (semiconductor 21) and the memory cell transistor MT_0 in the data writing and the data reading.

Figure 4:
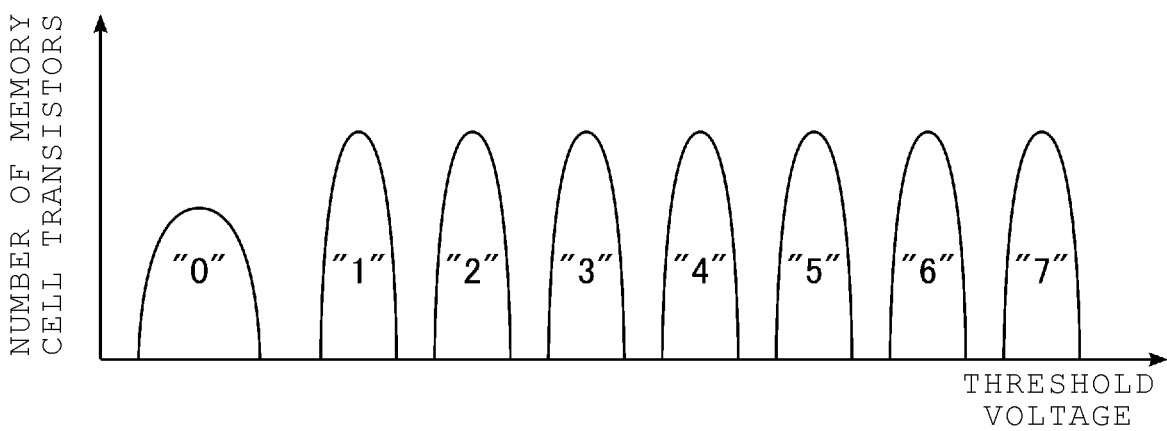
FIG. 4 is a diagram illustrating distribution of threshold voltages of memory cell transistors, to which data is written, the data in the storage device according to the first embodiment.

FIG. 4 illustrates distribution of threshold voltages of memory cell transistors MT in which data is written in the storage device 1 according to the first embodiment. FIG. 4 illustrates the example in which each memory cell transistor MT stores 3-bit data. The threshold voltage of each memory cell transistor MT has a magnitude in accordance with stored data based on the amount of electrons and the amount of holes in the charge storage film 54. In the example of FIG. 4, each memory cell transistor MT can be in one state among eight states in accordance with the threshold voltage. The eight states are respectively referred to as "0", "1", "2", "3", "4", "5", "6", "7", and "8" states. The memory cell transistors MT in the "0", "1", "2", "3", "4", "5", "6", "7" and "8" states have higher threshold voltages in this order. The "0" state is a state to which the memory cell transistor MT is shifted by the data erasing. The memory cell transistor MT in the "0" state has, for example, a negative threshold voltage and, for example, contains many holes.

According to the data writing, the memory cell transistor MT that is a write target is maintained in the "0" state or shifted to any one of "1", "2", "3", "4", "5", "6", "7", and "8" states based on the data to be written. Although the threshold voltage of the memory cell transistor MT maintained in the "8" state is not increased by the data writing, hereinafter, confining the memory cell transistor MT in the "0" state by the data writing is also provided in the data writing.

Since eight states are provided, eight different data can be assigned by the eight states, that is, 3-bit data can be assigned to each state. The combination of 3-bit values among 3-bit data of eight states is unique to each state. As long as it is satisfied, each state can be assigned with 3-bit data of any combination of values. Even the plurality of memory cell transistors MT storing the same 3-bit data may have different threshold voltages due to variations in characteristics of the memory cell transistors MT. For this reason, the threshold voltages are distributed in each state.

Data writing is performed by injecting electrons into the charge storage film of the memory cell transistor MT that is a writing target. The memory cell transistor MT containing more electrons in the charge storage film has higher threshold voltage. Data erasing is performed by removing electrons in the charge storage film of the memory cell transistor MT that is an erasing target. Due to the removal of electrons, the threshold voltage of the memory cell transistor MT that is an erasing target is lowered.

1.1.3. Driver and Row Decoder

Figure 5:
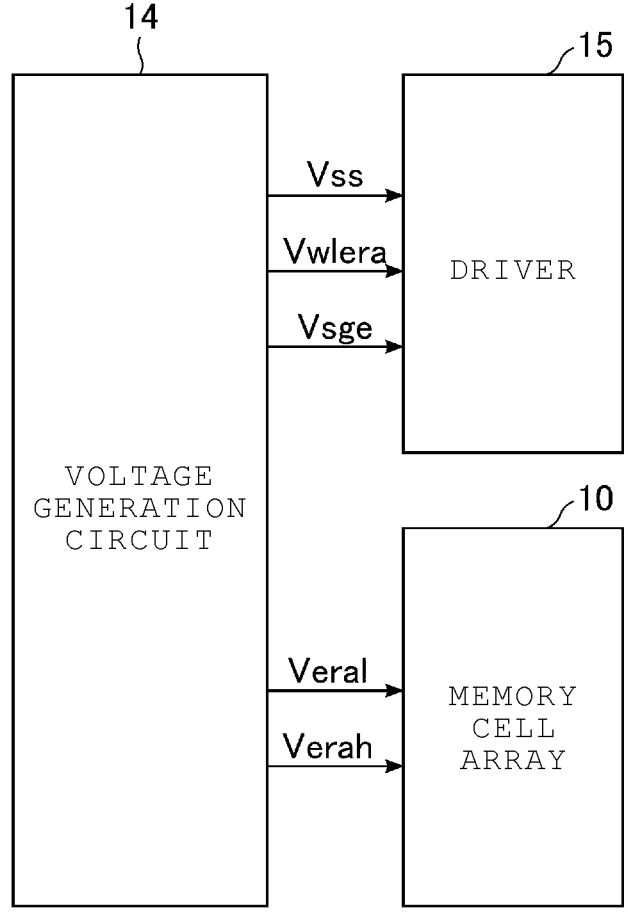
FIG. 5 is a diagram illustrating voltages output from a voltage generation circuit of the storage device according to the first embodiment.

FIG. 5 illustrates voltages output from the voltage generation circuit 14 of the storage device 1 according to the first embodiment. As illustrated in FIG. 5, the voltage generation circuit 14 outputs a ground voltage (common voltage) Vss, a low erase voltage Veral, a high erase voltage Verah, a select voltage Vsge, and a erase voltage Vwlera. The voltage generation circuit 14 includes, for example, a plurality of sub-voltage generation circuits, and each sub-voltage generation circuit generates and outputs the ground voltage Vss, the low erase voltage Veral, the high erase voltage Verah, the select voltage Vsge, and the erase voltage Vwlera. The ground voltage Vss, the voltage Vwlera, and the select voltage Vsge are supplied to the driver 15. The low erase voltage Veral and the high erase voltage Verah are supplied to the memory cell array 10.

The ground voltage Vss has, for example, a positive magnitude of 0 V or near 0 V.

The high erase voltage Verah is higher than 0 V. The high erase voltage Verah has a size capable of injecting the holes into the portion of the charge storage film 54 provided in the memory cell transistor MT by applying the voltage having a magnitude of the difference between the high erase voltage Verah and the ground voltage Vss to a region between the control gate electrode of the memory cell transistor MT and the semiconductor 51. In the following, in some cases, the portion of the charge storage film 54 provided in the certain memory cell transistor MT may be simply referred to as the charge storage film 54 of the memory cell transistor MT. In some cases, the portion of the charge storage film 54 provided in the certain memory cell transistor MT may be simply referred to as the charge storage film 54 of the memory cell transistor MT.

The low erase voltage Veral is higher than 0 V and lower than the high erase voltage Verah. The low erase voltage Veral has a size capable of injecting the holes into the charge storage film 54 of the memory cell transistor MT by applying the voltage having a magnitude of the difference between the low erase voltage Veral and the ground voltage Vss to a region between the control gate electrode of the memory cell transistor MT and the semiconductor 51. Since the low erase voltage Veral is lower than the high erase voltage Verah, the force of injecting the holes by applying the low erase voltage Veral is weaker than the force of injecting the holes by applying the high erase voltage Verah.

The voltage Vwlera is higher than 0 V and lower than the high erase voltage Verah. The low erase voltage Veral has a size capable of minimizing the injection of the holes into the charge storage film 54 of the memory cell transistor MT even when the voltage having a magnitude of the difference between the high erase voltage Verah and the voltage Vwlera is applied to a region between the control gate electrode of the memory cell transistor MT and the semiconductor 51. The voltage Vwlera has a magnitude close to the magnitude of the low erase voltage Veral. The voltage Vwlera has, for example, 80% or more and 120% or less of the magnitude of the low erase voltage Veral. The voltage Vwlera has, for example, substantially the same magnitude as the low erase voltage Veral. The fact that two physical quantities have "substantially the same magnitude" denotes that the physical quantities of the two elements are intended to have the same magnitude, but the state that the physical quantities are not completely the same due to manufacturing tolerances and/or device performance variations, or the like.

The select voltage Vsge is higher than 0 V and lower than the high erase voltage Verah. A select voltage sge has a magnitude capable of allowing the GIDL current to occur in the select gate transistor ST when applied to the select gate transistor ST while the high erase voltage Verah is applied to the source line SL.

1.1.4. Driver and Row Decoder

Figure 6:
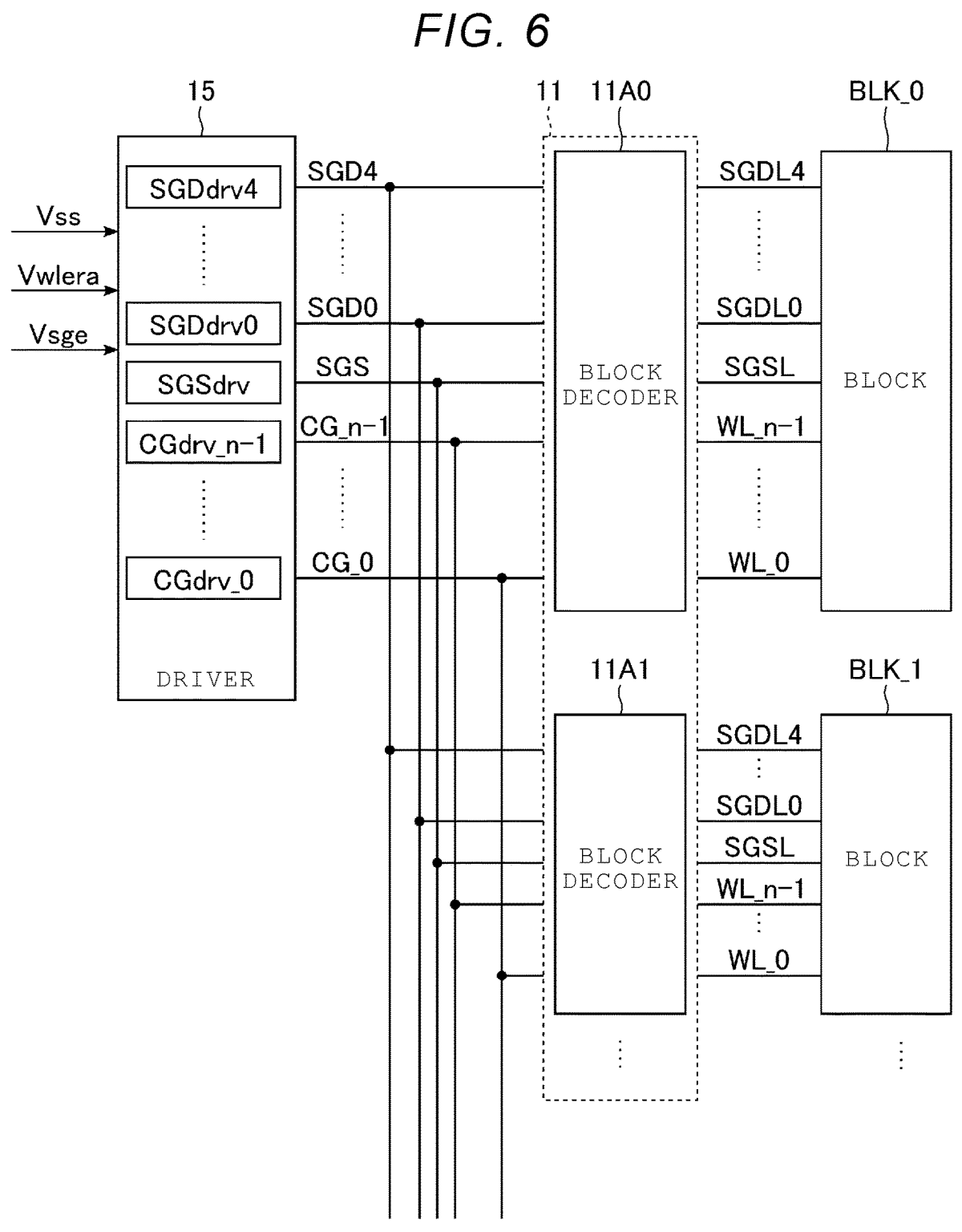

FIG. 6 illustrates an example of the driver and the row decoders of the storage device according to the first embodiment, and related functional blocks.

As illustrated in FIG. 6, the driver 15 includes the same number of drivers SGDdry (SGDdrv0 to SGDdrv4) as the number of string units SU provided in one block BLK and one driver SGSdrv. The driver 15 also includes the same number of drivers CGdry (CGdry_0 to CGdry_7) as the word lines WL provided in one NAND string NS.

Each of the drivers SGDdrv0 to SGDdrv4, SGSdrv, and CGdry_0 to CGdry_n−1 receives the voltage from the voltage generation circuit 14. The drivers SGDdrv0 to SGDdrv3, SGSdrv, and CGdry_0 to CGdry_n–1 supply one of the received voltages instructed by sequencer 13 to wirings SGD0 to SGD3, SGS, and CG_0 to CG_n–1, respectively.

The row decoder 11 includes, for example, the same number of block decoders 11A (11A0, 11A1, . . . ) as the number of block BLKs. Each block decoder 11A is associated with one block BLK. Each block decoder 11A is connected to wirings SGD0 to SGD3, SGS, and CG_0 to CG_n–1 of the associated block BLK. Each block decoder 11A is selected based on the block address in the address information ADD. The selected block decoder 11A connects the wirings SGD0 to SGD3, SGS, and CG_0 to CG_n–1 to select gate lines SGDL0 to SGDL3, the select gate line SGSL, and the word lines WL_0 to WL_n–1 connected to the block decoder 11A, respectively. Due to the connection by the block decoder 11A, the voltages of the wirings SGD0 to SGD3, SGS, and CG_0 to CG_n–1 are transferred to the select gate lines SGDL0 to SGDL3, the select gate line SGSL, and the word lines WL_0 to WL_n–1, respectively.

1.2. Operation

Figure 7:
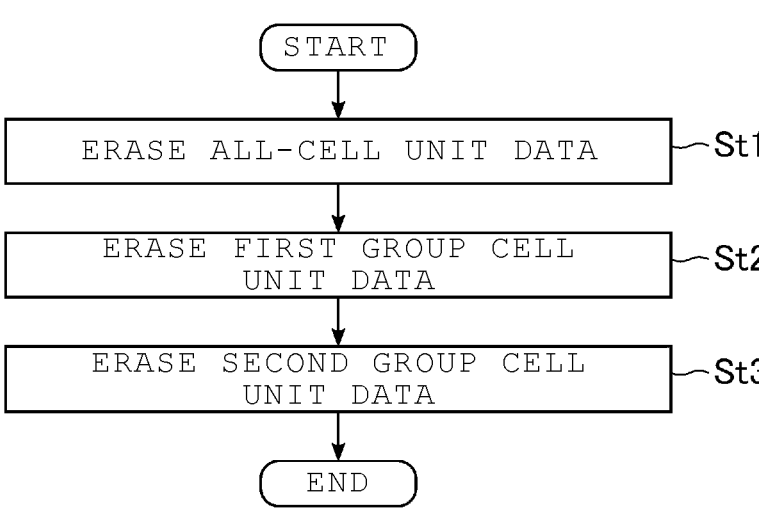
FIG. 7 is a diagram illustrating a flow of data erasing of the storage device according to the first embodiment.

FIG. 7 illustrates a flow of the data erasing of the storage device 1 according to the first embodiment. FIG. 7 illustrates one block BLK that is a data erasing target. In some cases, the block BLK that is a data erasing target may be referred to as the selected block BLKs. The flow of FIG. 7 starts when the storage device 1 receives a command instructing data erasing specifying the selected block BLKs. The data erasing is performed in parallel on the all cell units CU that are data erasing targets in the selected block BLKs. Some steps in the flow will be described in detail later.

The sequencer 13 performs the all-cell unit data erasing (St1). The all-cell unit data erasing includes applying voltages for the data erasing to all cell units CU that are data erasing targets and related wiring in the selected block BLKs. The all-cell unit data erasing is named as a contrast with applying the voltage for the data erasing to the specific cell unit CU among the all cell units CU that is a data erasing target in the selected block BLKs and to related wirings, which will be described later. Therefore, the all-cell unit data erasing does not necessarily require the all cell units CU as a target in the selected block BLKs. For the purpose of simplifying the description, the "all cell units CU that are data erase target in the selected block BLKs" may hereinafter be simply referred to as "all cell units CU in the selected block BLKs". The following description is based on the example in which all cell units CU in the selected block BLKs are all cell units CU of the data erasing target in the selected block BLKs.

The sequencer 13 performs the first group cell unit data erasing (St2). The first group cell unit data erasing denotes applying the voltage for the data erasing to the specific cell unit CU among all the cell units CU in the selected block BLKs and to related wiring. The all cell units CU in the selected block BLKs are divided into the first group and the second group. The first group is a set of the cell units CU connected to the word lines WL (WL_2k) having the even-numbered addresses, and the second group is a set of the cell units CU connected to the word lines WL having the odd-numbered addresses (WL_2k+1) (k is a positive integer of 0 or more). Therefore, the first group cell units CU and the second group cell units CU are aligned alternately one by one along the z-axis. The first group may be a set of the cell units CU connected to the word lines WL having odd-numbered addresses, and the second group may be a set of the cell units CU connected to the word lines WL having even-numbered addresses. Hereinafter, in some cases, the memory cell transistors MT of the first group cell unit CU may be referred to as first group memory cell transistors MT. In some cases, the memory cell transistors MT of the second group cell unit CU may be referred to as second group memory cell transistors MT.

In the first group cell unit data erasing, the voltage for the data erasing is applied to the first group cell unit CU and related wiring, and on the other hand, the voltage for the data erasing is not applied to the cell units CU of the second group.

The sequencer 13 performs the second group cell unit data erasing (St3). The second group cell unit data erasing denotes applying the voltage for the data erasing to the specific cell unit CU among all the cell units CU in the selected block BLKs and to related wiring. In the second group cell unit data erasing, the voltage for the data erasing is applied to the second group cell unit CU and related wiring, while no voltage for the data erasing is applied to the first group cell unit CU.

With the end of step St3, the flow of FIG. 7 ends.

1.2.1. All the Cell Unit Data Erasing

Figure 8:
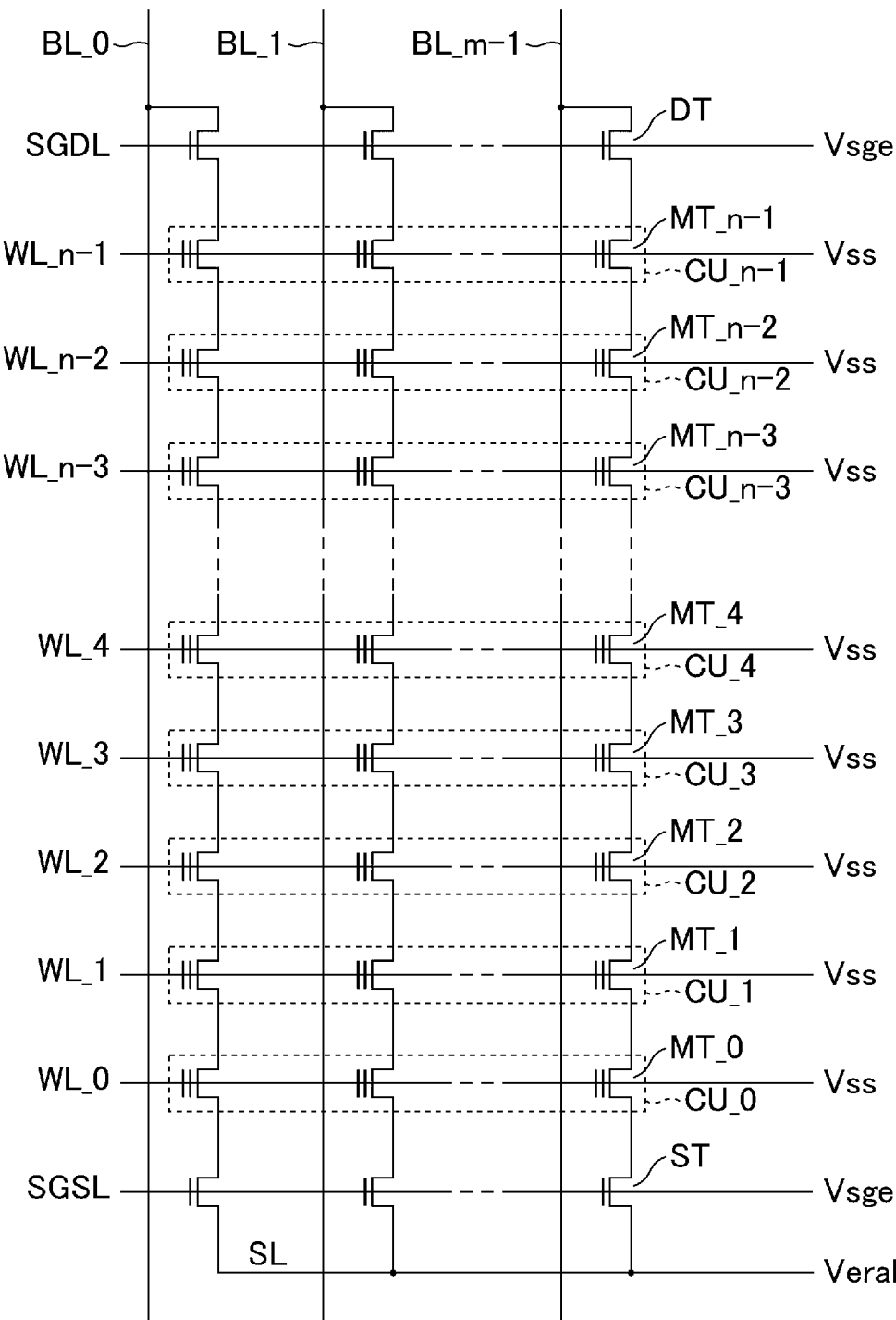
FIG. 8 is a diagram illustrating one state during the data erasing in the storage device according to the first embodiment.

FIG. 8 illustrates one state during the data erasing in the storage device 1 according to the first embodiment. FIG. 8 illustrates voltages applied to the wiring during the all-cell unit data erasing of the selected block BLKs.

As illustrated in FIG. 8, the source line SL continues to receive the low erase voltage Veral. The select gate lines SGDL and SGSL continue to receive the select voltage Vsge. The bit line BL receives any voltage and continues to receive, for example, the ground voltage Vss. While such voltages are applied to the source line SL and the select gate line SGSL, the ground voltage Vss is applied to the word lines WL respectively connected to all the cell units CU of the selected block BLKs. In some cases, the "word lines WL respectively connected to all the cell units CU of the selected block BLKs" and similar components may be referred to as "all the word lines WL of the selected block BLKs". Hereinafter, one NAND string NS in the selected block BLKs will be described. However, the phenomenon described below for one NAND string NS occurs in other, for example, all the NAND strings NS in the selected block BLKs.

The holes are generated in the semiconductor 51 by applying the voltages illustrated in FIG. 8. The generated holes diffuse in the semiconductor 51.

Due to the application of the voltages illustrated in FIG. 8, a low potential difference (Veral–Vss) occurs between the control gate electrode and the semiconductor 51 in all the memory cell transistors MT in the NAND string NS. Due to this potential difference Veral, the holes in the semiconductor 51 enter a portion of the charge storage film 54 facing each word line WL in the selected block BLKs. The holes entering are recombined with the electrons in the charge storage film 54. Due to the recombination, the electrons in the charge storage film 54 disappear, and the amount of electrons in the charge storage film 54 is decreased. Accordingly, the threshold voltages of all the memory cell transistors MT in the NAND string NS are lowered, and thus, data is erased. Further, the holes enter, and thus, the holes remain in the charge storage film 54 without being recombined with the electrons. The increase in the holes lowers the threshold voltage of the memory cell transistor MT.

Hereinafter, in some cases, the data erasing by applying a voltage having a magnitude of the low erase voltage Veral—the ground voltage Vss to the control gate electrode and the semiconductor 51 may be referred to as weak erasing.

1.2.2. First Group Cell Unit Data Erasing

Figure 9:
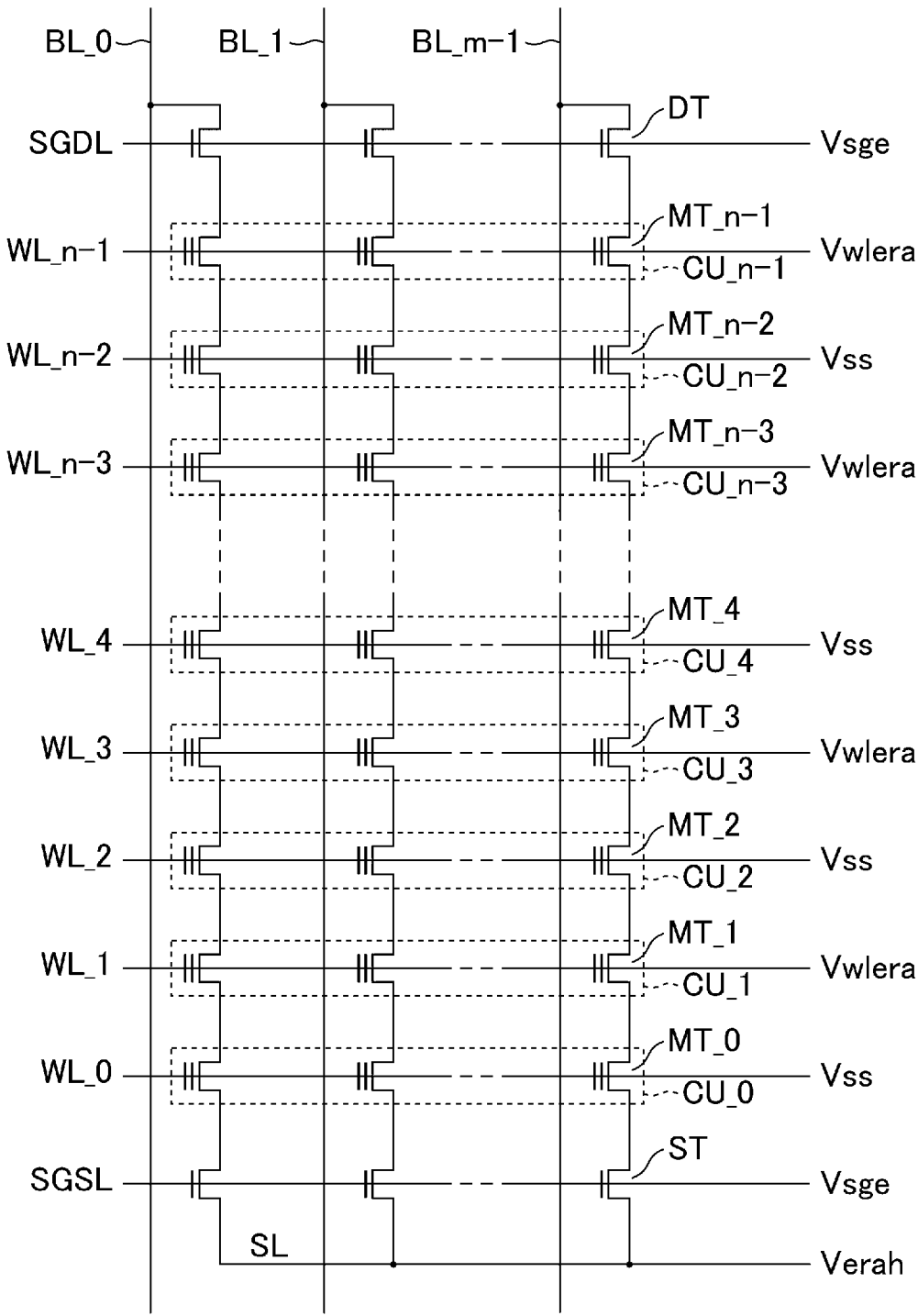
FIG. 9 is a diagram illustrating one state during the data erasing in the storage device according to the first embodiment.

FIG. 9 illustrates one state during the data erasing in the storage device 1 according to the first embodiment. FIG. 9 illustrates the voltages applied to the wiring during the first group cell unit data erasing of the selected block BLKs.

In the first group cell unit data erasing, the select gate line SGDL and the select gate line SGSL continue to receive the select voltage Vsge, and the bit line BL continues to receive any voltage, as in the case of the erasing of all the cell unit data. On the other hand, in the first group cell unit data erasing, the source line SL continues to receive the high erase voltage Verah.

In a state where this voltage is applied, the ground voltage Vss is applied to the word lines WL respectively connected to the first group cell units CU in the selected block BLKs. The "word lines WL respectively connected to the first group cell units CU in the selected block BLKs" may be referred to as "first group word lines WL". Similarly, the "word lines WL respectively connected to the second group cell units CU in the selected block BLKs" may be referred to as "second group word lines WL". The second group word lines WL continue to receive the low erase voltage Veral.

The holes are generated in the semiconductor 51 by applying the voltages illustrated in FIG. 9. The generated holes diffuse in the semiconductor 51.

Due to the application of the voltages illustrated in FIG. 9, a high potential difference (Verah−Vss) occurs between the control gate electrode and the semiconductor 51 in the first group memory cell transistors MT in the NAND string NS. Due to this potential difference Verah, the holes in the semiconductor 51 enter a portion of the charge storage film 54 in the first group memory cell transistor MT. The holes entering lower the threshold voltage of the first group memory cell transistor MT, and thus, the data is erased. Further, the holes enter, and thus, the holes remain in the charge storage film 54 without being recombined with the electrons. The increase in the holes lowers the threshold voltage of the first group memory cell transistors MT.

In some cases, the injection of the holes and the data erasing by applying the voltage having a magnitude of the high erase voltage Verah—the ground voltage Vss to the control gate electrode and the semiconductor 51 may be hereinafter referred to as strong erasing.

During the first group cell unit data erasing, only the low potential difference (Verah−Vwlera) occurs between the control gate electrode and the semiconductor 51 in the second group memory cell transistor MT. Therefore, the entering of the holes into the portion of the second group memory cell transistor MT of the charge storage film 54 is prevented.

1.2.3. Second Group Cell Unit Data Erasing

Figure 10:
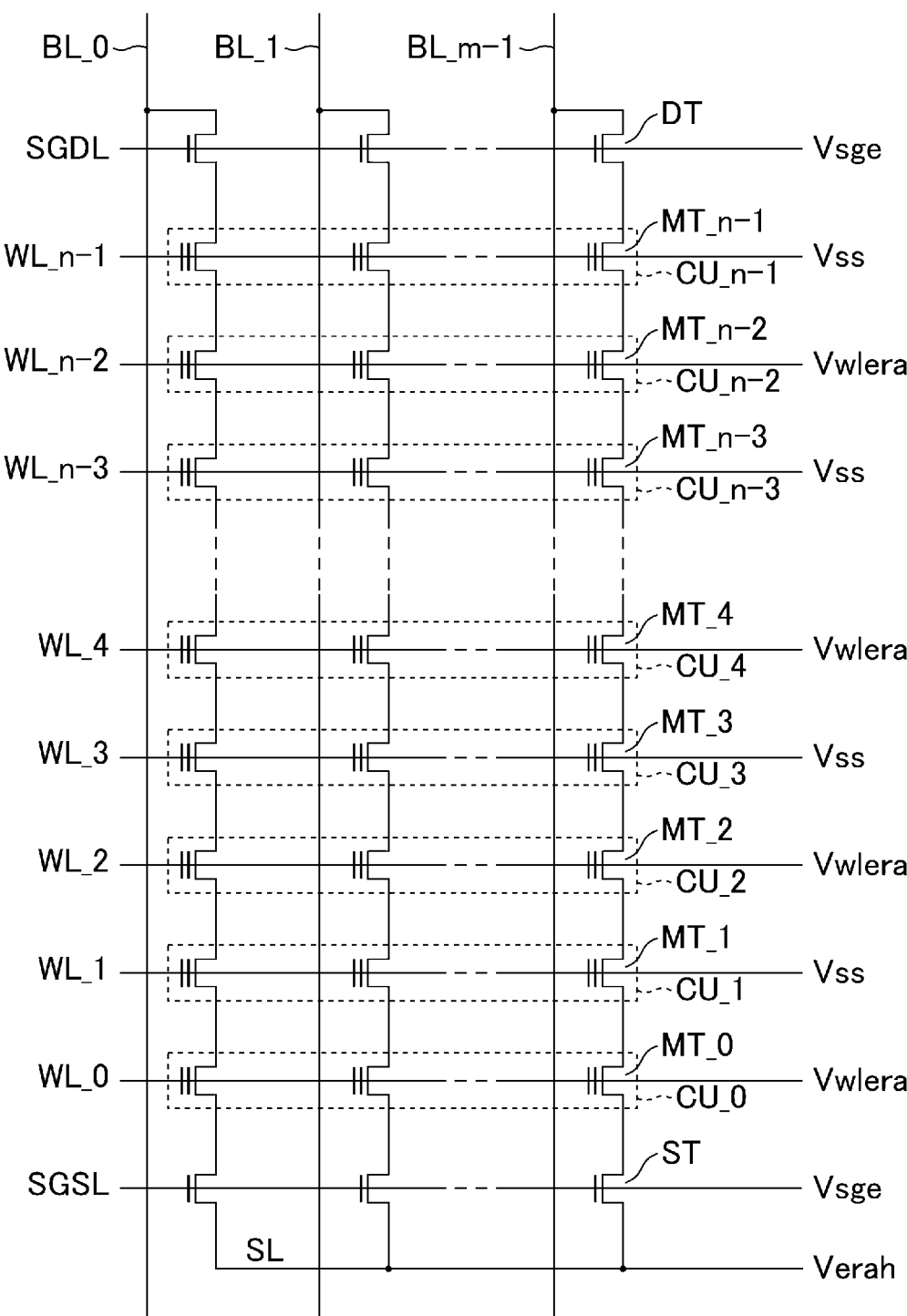
FIG. 10 is a diagram illustrating one state during the data erasing in the storage device according to the first embodiment.

FIG. 10 illustrates one state during the data erasing in the storage device 1 according to the first embodiment. FIG. 10 illustrates the voltages applied to the wiring during the second group cell unit data erasing of the selected block BLKs.

In the second group cell unit data erasing, as in the first group cell unit data erasing, the select gate line SGDL and the select gate line SGSL continue to receive the select voltage Vsge, the bit line BL continues to receive any voltage, and the source line SL continues to receive the high erase voltage Verah.

The holes are generated in the semiconductor 51 by applying the voltages illustrated in FIG. 10. The generated holes diffuse in the semiconductor 51.

Due to the application of the voltages illustrated in FIG. 10, the high potential difference (Verah−Vss) occurs between the control gate electrode and the semiconductor 51 in the second group memory cell transistors MT in the NAND string NS. That is, strong erasing is performed on the second group memory cell transistors MT. As a result, the threshold voltage of the second group memory cell transistor MT is lowered.

During the second group cell unit data erasing, only the low potential difference (Verah−Vwlera) occurs between the control gate electrode and the semiconductor 51 in the first group memory cell transistor MT. Therefore, the entering of the holes into the portion of the first group memory cell transistor MT of the charge storage film 54 is prevented.

1.2.4. Voltage Waveform During Data Erasing

Figure 11:
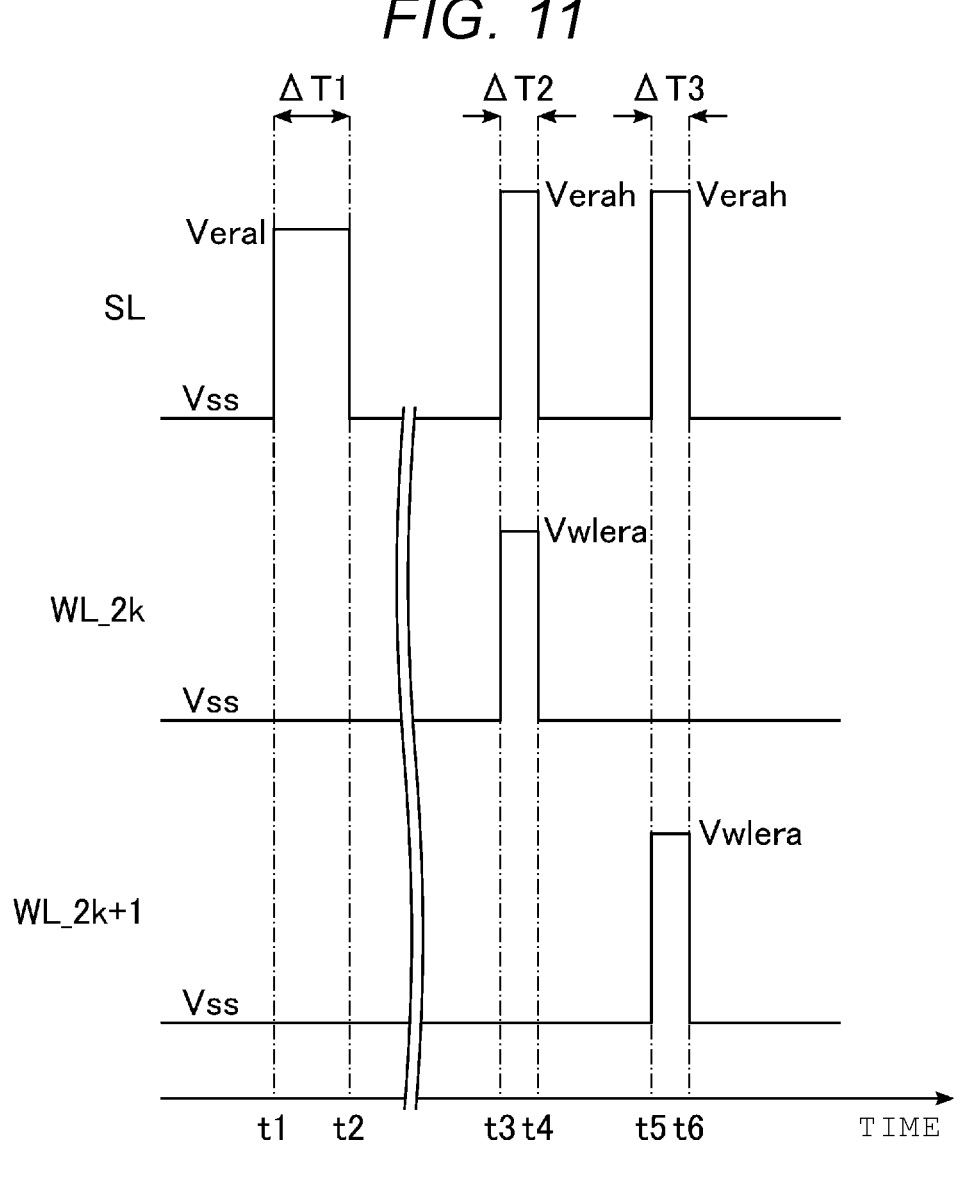
FIG. 11 is a diagram illustrating voltages applied to source lines over time during the data erasing in the storage device according to the first embodiment.

FIG. 11 illustrates, over time, waveforms of voltages applied to the source lines during the data erasing in the storage device according to the first embodiment.

As illustrated in FIG. 11, the low erase voltage Veral is applied to the source line SL from time t1 to time t2. The time t2 is a time after the period ΔT1 from time t1. From time t1 to time t2, the voltage Vss is applied to a first group word line WL (WL_2$k$) and a second group word line WL (WL_2$k$+1). The application of the voltage for the period from time t1 to time t2 occurs during all-cell unit data erasing described above with reference to FIG. 8.

The high erase voltage Verah is applied to the source line SL from time t3 to time t4. Time t4 is a time after the period ΔT2 from time t3. In addition, from time t3 to time t4, the voltage Vwlera is applied to the first group word line WL (WL_2$k$). On the other hand, from time t3 to time t4, the voltage Vss is applied to the second group word line WL (WL_2$k$+1). The application of the voltage for the period from time t3 to time t4 occurs during the first group cell unit data erasing described above with reference to FIG. 9. The period ΔT2 is shorter than the period ΔT1. That is, the period for the all-cell unit data erasing, in other words, the period in which the state illustrated in FIG. 8 occurs, is shorter than the period for the first group cell unit data erasing, in other words, the period in which the state illustrated in FIG. 9 occurs.

The high erase voltage Verah is applied to the source line SL from time t5 to time t6. Time t6 is a time after the period ΔT3 from time t5. In addition, from time t5 to time t6, the voltage Vwlera is applied to the second group word line WL (WL_2$k$+1). On the other hand, from time t5 to time t6, the voltage Vss is applied to the first group word line WL (WL_2$k$). The application of the voltage for the period from time t5 to time t6 occurs during the second group cell unit data erasing described above with reference to FIG. 10. The period ΔT3 is shorter than the period ΔT1. That is, the period for the all-cell unit data erasing, in other words, the period in which the state of FIG. 8 occurs is shorter than the period for the second group cell unit data erasing, in other words, the period in which the state of FIG. 10 occurs. The period ΔT3 may be the same as or different from the period ΔT2.

After time t6, the operations from time t1 to time t6 may be repeated. That is, the data erasing may include a plurality of erase loops. Each erase loop includes the voltage application for the data erasing and the erase verification as described above with reference to FIGS. 8 to 10. The erase verification denotes checking whether the memory cell transistor MT that is a data erasing target has a threshold voltage lower than a required voltage by applying the voltage for the data erasing. When the erase verification in a certain loop fails, the next erase loop can be performed. Subsequent erase loops may use slightly higher voltages than the voltages used in the previous erase loops.

However, in the first embodiment, since one erase loop includes the weak erasing for the all cell units CU and the strong erasing for each of the first and the second group cell units CU, in one erase loop, there is a high possibility that the memory cell transistor MT has a lower threshold voltage than the required voltage. That is, there is a high possibility that the erase verification will be passed when the erase verification is performed. Therefore, in the first embodiment, there is a high possibility that the data erasing may be completed by executing one erase loop, and the need for executing the second erase loop is low. Of course, second and subsequent erase loops may be performed. In this case, the high erase voltage Verah and the low erase voltage Veral in a certain erase loop are by $\Delta V1$ and $\Delta V2$ higher than the once-previous high erase voltage Verah and the once-previous low erase voltage Veral, respectively.

1.2.5. State Immediately After Data Erasing

Figure 12:
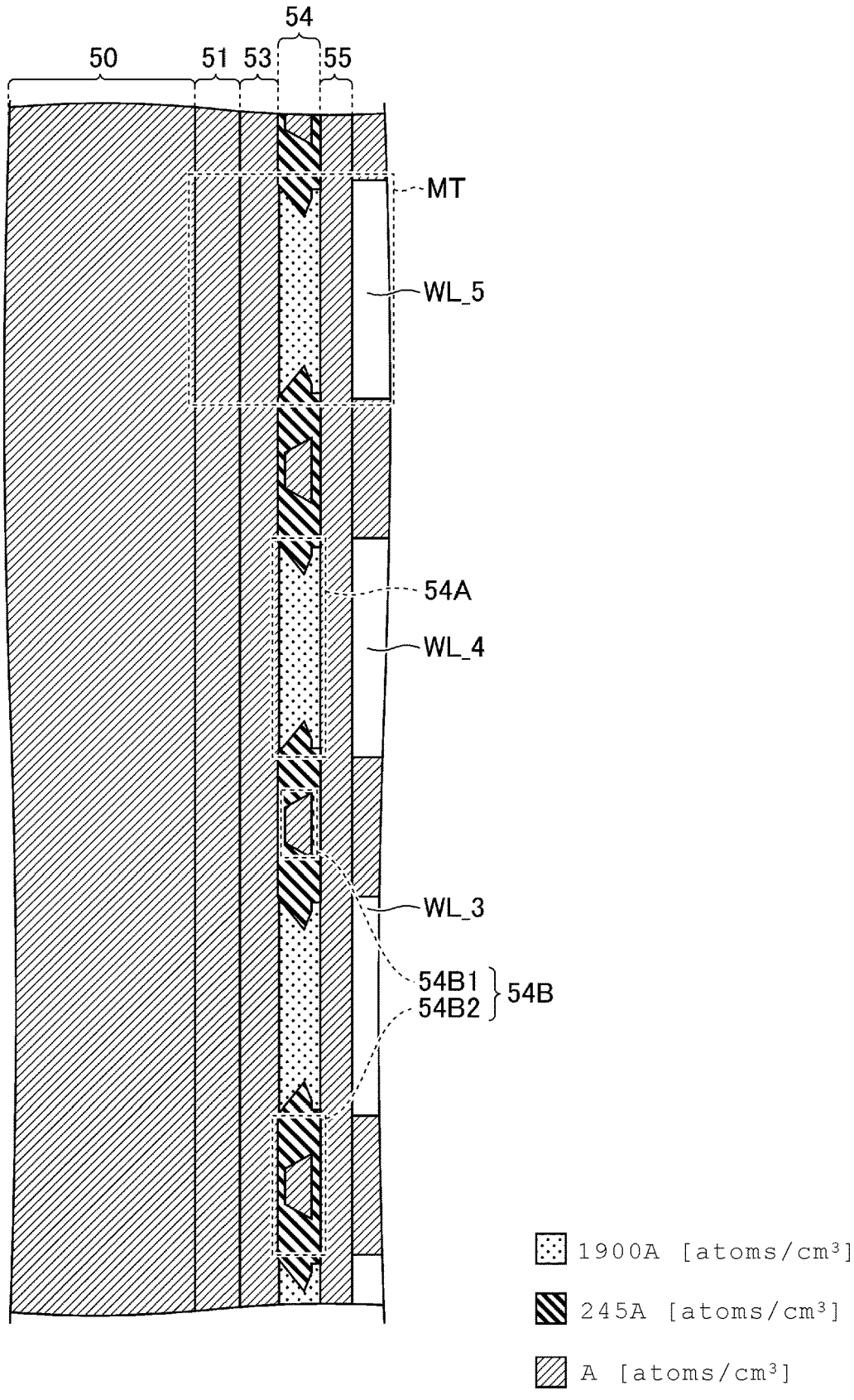
FIG. 12 is a diagram schematically illustrating a state immediately after erasing a portion of the data in the storage device according to the first embodiment.

FIG. 12 schematically illustrates the state immediately after the data erasing of a portion of the storage device 1 according to the first embodiment. FIG. 12 illustrates the distribution of the holes and the electrons in the memory cell transistor MT immediately after the data erasing is performed.

As illustrated in FIG. 12, a portion 54A of the charge storage film 54 facing the word line WL contains the high concentration of the holes. Since each portion 54A contains the high concentration of the holes, each memory cell transistor MT has the negative threshold voltage.

A portion 54B of the charge storage film 54 not facing the word lines WL, that is, the portion 54B of the charge storage film 54 facing the region between the word lines WL also contains the holes. The portion 54B is made of a central sub-portion 54B1 and other sub-portions 54B2. The sub-portion 54B2 contains a medium concentration of the holes. A hole concentration in the portion 54B is lower than a hole concentration in the portion 54A.

Portions other than the portion 54A and the sub-portion 54B2, including the sub-portion 54B1, contain only low concentrations of holes or almost no holes.

The concentration of the holes and a magnitude of the threshold voltage are correlated. The periods ($\Delta T1$, $\Delta T2$, and $\Delta T3$ in FIG. 11) of the application of the voltage for the data erasing described above with reference to FIGS. 8 to 10 are set in advance so as to have the required negative threshold voltage of each memory cell transistor MT immediately after the data erasing. As a result, the distribution of the holes illustrated in FIG. 12 can be obtained. The hole concentration in the portion 54A is a dominant factor that determines the magnitude of the threshold voltage of the memory cell transistor MT. In addition, the holes in the sub-portion 54B2 also affect the magnitudes of the threshold voltages of the memory cell transistors MT on both sides of the sub-portion 54B2. Based on the fact that the portion 54A contains the high concentration of the holes and the sub-portion 54B2 also contains the medium concentration of the holes, each memory cell transistor MT has a required (or designed) threshold voltage.

Such a concentration distribution of the holes is roughly formed through the following process. That is, by the all-cell unit data erasing, the medium concentration of the holes widely enter the portion of the charge storage film 54 excluding the sub-portion 54B2. By the subsequent first group cell unit data erasing, the holes enter the portion of the charge storage film 54 in the first group memory cell transistor MT, and the hole concentration of the portion of the charge storage film 54 in the first group memory cell transistor MT is increased. During the first group cell unit data erasing, the entering of the holes into the portion of the charge storage film 54 in the second group memory cell transistor MT is prevented, and therefore, the increase in the hole concentration of the portion of the charge storage film 54 in the second group memory cell transistor MT is prevented. By the subsequent second group cell unit data erasing, the holes enter the portion of the charge storage film 54 in the second group memory cell transistor MT, and the hole concentration of the portion of the charge storage film 54 in the second group memory cell transistor MT is increased. During the second group cell unit data erasing, the entering of the holes into the portion of the charge storage film 54 in the first group memory cell transistor MT is prevented, and therefore, the increase in the hole concentration of the portion of the charge storage film 54 in the first group memory cell transistor MT is prevented.

The low erase voltage Veral has a magnitude enabling the charge storage film 54 to have the hole concentration as illustrated in FIG. 12 after the subsequent first and second group cell unit data erasing. That is, when the low erase voltage Veral is too high, the all-cell unit data erasing will approach the case where the high erase voltage Verah is used. This denotes that the formation of the sub-portion 54B2 is inhibited, and thus, the medium concentration of the holes also enter the portion 54B uniformly.

On the other hand, when the low erase voltage Veral is too low, only the small amount of holes will be injected into the charge storage film 54 during the all-cell unit data erasing. As a result, a large potential is formed between the charge storage film 54 and the word line WL during the first and second group cell unit data erasing. This potential difference causes the electrons to enter the charge storage film 54 from the word line WL via the block insulator 55. The electrons are located around the corners of each word line WL, that is, around both ends of the portion 54B of the charge storage film 54. The electrons attract holes in the periphery, and the attracted holes can be recombined with the electrons in the memory cell transistor MT to which data is written. This deteriorates the data retention characteristics of the memory cell transistor MT. In addition, the attracted holes reduce the holes in the memory cell transistor MT in the "0" state. This deteriorates the data retention characteristics of the memory cell transistor MT in the "0" state. Such intrusion of electrons is considered to be caused by the large bias in the electric field due to the presence of the high-potential charge storage film 54, the low-potential word line WL, and the adjacent high-potential word line WL. For this reason, when the number of holes injected into the charge storage film 54 during the all-cell unit data erasing is small, the potential difference between the charge storage film 54 and the word line WL is large, and electrons easily enter the charge storage film 54.

Based on the above, the low erase voltage Veral has a magnitude that allows neither too many nor too few holes to enter the charge storage film 54 during the all-cell unit data erasing. The low erase voltage Veral has a magnitude of, for example, 65% or more and 85% or less of the high erase voltage Verah. Based on the example where the high erase voltage Verah is 20 V, the low erase voltage Veral has a magnitude of 13 V to 17 V.

1.3. Advantages (Effects)

According to the first embodiment, as described below, there can be provided a storage device that can erase data in a short time, has high data retention characteristics, and realizes a memory cell transistor having a low threshold voltage in a data erasing state.

Two methods of data erasing are known. The first method includes applying the high erase voltage Verah to the source line SL while applying the ground voltage Vss to all the word lines WL of the selected block BLKs. The second method includes applying the high erase voltage Verah to the source line SL, while applying the ground voltage Vss and the high erase voltage Verah to the first and second group word lines WL, respectively, and then applying the high erase voltage Verah and the ground voltage Vss to the first and second group word lines WL, respectively.

As a result of the execution of the first method, the portion 54A of the charge storage film 54 contains the high concentration of the holes, and the portion 54B uniformly contains the medium concentration of the holes including the center thereof. After the first method, when data is written to a memory cell transistor MTs that is a write target after the data erasing, the following phenomenon may occur. That is, when a memory cell transistor MTn adjacent to the memory cell transistor MTs is in the "0" state after the data writing, a medium concentration of the holes exist in a wide region between the memory cell transistors MTs and MTn in the charge storage film 54. The holes are attracted by the electrons in the memory cell transistor MTs, moved into the memory cell transistor MTs, and can be recombined with the electrons. This deteriorates the data retention characteristics of the memory cell transistor MTs. The migration of holes also increases the threshold voltage of the memory cell transistor MTn, that is, deteriorates the data retention characteristics of the memory cell transistor MTn.

According to the second method, the portion 54A of the charge storage film 54 contains the high concentration of the holes, the portion 54B contains the medium concentration of the holes only at both ends thereof, and the other portions contain almost no holes. That is, the charge storage film 54 contains the medium concentration of the holes only in small regions on both ends of the portion 54A, and contains almost no holes in most of the region between the portions 54A. For this reason, the holes between the portions 54A are less likely to be recombined with the electrons in the memory cell transistors MTs to which data is written. That is, the memory cell transistor MTs has high data retention characteristics.

However, in the second method, since the number of holes between the portions 54A is small, it is difficult for the threshold voltage of the memory cell transistor MT in the data erasing state, and thus in the "0" state, to be lowered. Therefore, the required threshold voltage may not be achieved. In addition, in the second method, during the data erasing, due to the potential difference between the high potential of the charge storage film 54 and the low potential of the word line WL, as a magnitude of the low erase voltage Veral is described above with reference to FIG. 12, the electrons enter the charge storage film 54 from the word line WL via the block insulator 55. In the second method, at the start of data erasing, almost no holes exist in the charge storage film 54, and the potential of the charge storage film 54 is low. For this reason, the potential difference between the charge storage film 54 and the word line WL caused by the application of the voltage for the data erasing is large, and electrons are likely to enter. This deteriorates the data retention characteristics of the memory cell transistor MT in the "0" state.

According to the first embodiment, weak erasing is performed on the all cell units CU of the selected block BLKs, and strong erasing is performed on the first group cell unit CU while the voltage application to the second group cell unit CU is prevented, and strong erasing is performed on the second group cell unit CU while the voltage application to the first group cell unit CU is prevented. By applying the voltage for erasing to the all cell units CU, the holes also enter the portion 54B, unlike the second method. On the other hand, due to the weak erasing to the all cell units CU, the medium concentration region of holes is formed in the sub-portion 54B2 other than the center of the portion 54B. Due to the subsequent strong erasing to the first or second group cell unit CU, the portion 54A is in the state containing the sufficiently high concentration of the holes, that is, the same high concentration of the holes as the case using the first and second methods. Due to the high concentration of the holes in the portion 54A and the medium concentration of the holes in the sub-portion 54B2 of the portion 54B, the memory cell transistor MT in the data erasing state and "0" state can have the low threshold voltage.

In addition, the charge storage film 54 already contains medium concentration of the holes due to the end of all-cell unit data erasing. Therefore, the magnitude and bias of the electric field between the plurality of word lines WL and the charge storage film 54 formed by the first and second group cell unit data erasing are small. The electrons are prevented from entering the charge storage film 54 due to the electric field with the large magnitude and bias. Therefore, the deterioration of the data retention characteristics due to the electrons entering the charge storage film 54 as in the second method is prevented.

As described above, the storage device 1 can have the memory cell transistor MT that has the high data retention characteristics and the low threshold voltage in the data erasing state (and "0" state).

In addition, the storage device 1 according to the first embodiment can complete the data erasing in a shorter time than the time required for the data erasing by the second method. In the second method, the first erase loop requires the period of time t3 to time t6 described above with reference to FIG. 11. In the second method, since it is difficult for the data erasing to be completed (that is, to pass the erase verification) only in the first erase loop, in many cases, the second erase loop is needed. In this case, the period from time t3 to time t6 is repeated twice. The total time of these two repetitions is longer than the period from time t1 to time t6 in the first embodiment. On the other hand, as described above with reference to FIG. 11, in the first embodiment, the data erasing is likely to be completed in the first loop. Therefore, the time required for the storage device 1 to the data erasing is shorter than the time required for the data erasing by the second method.

1.4. Modified Example

The semiconductor 21 may contain arsenic-doped silicon or be made of arsenic-doped silicon and have a p-type conductivity. In this case, the configuration for generating the GIDL current described above with reference to FIG. 3 is not required, that is, the semiconductor 51 may not contain phosphorus in the distribution described above with reference to FIG. 3. In this case, during the all-cell unit data erasing (refer to FIG. 8) and during the first group cell unit data erasing (refer to FIG. 9) and the second group cell unit data erasing (refer to FIG. 10), the select gate line SGSL receives a voltage Vsg. The voltage Vsg is higher than 0 V, has a magnitude that turns on the select gate transistor ST, and is supplied from the voltage generation circuit 14.

The GIDL current may be supplied from the select gate transistor DT instead of the select gate transistor ST or in addition to the select gate transistor ST. In this case, each select gate transistor DT has a configuration capable of generating the GIDL current, similarly to the select gate transistor ST described above with reference to FIG. 3. That is, the portion of the set of the semiconductor 51 and the conductor 25 including the end of the conductor 27 side contains phosphorus (or arsenic) and has an n-type conductivity. The phosphorus is distributed, for example, as follows. That is, the portion of the set of the semiconductor 51 and the conductor 25 from the upper surface of the conductor 25 to the center of the conductor 24 or a vicinity thereof contains phosphorus at the high concentration, for example, $1 \times 10^{19}$ atoms/cm³ or more. The portion of the set of semiconductor 51 and the conductor 25 below the center of the conductor 24 contains the lower concentration of phosphorous. Due to such impurity concentration distribution, the select gate transistor DT functions as a switch capable of generating the GIDL current in the upper portion and controlling the connection and the disconnection between the bit line BL (conductor 26) and the memory cell transistor MT_n–1 in the lower portion.

Figure 13:
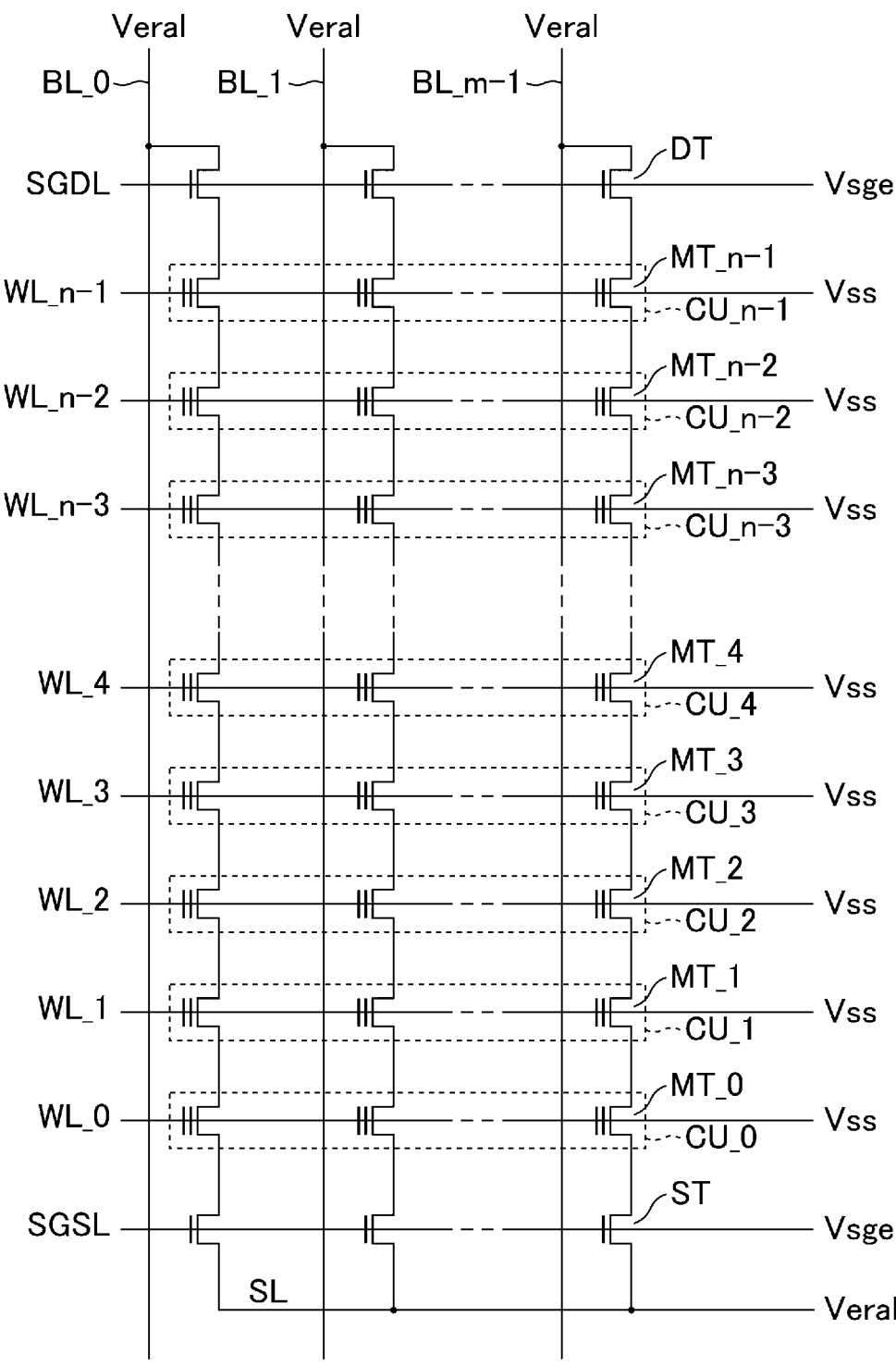
FIG. 13 is a diagram illustrating one state during the data erasing of a storage device according to Modified Example 1 of the first embodiment.
Figure 14:
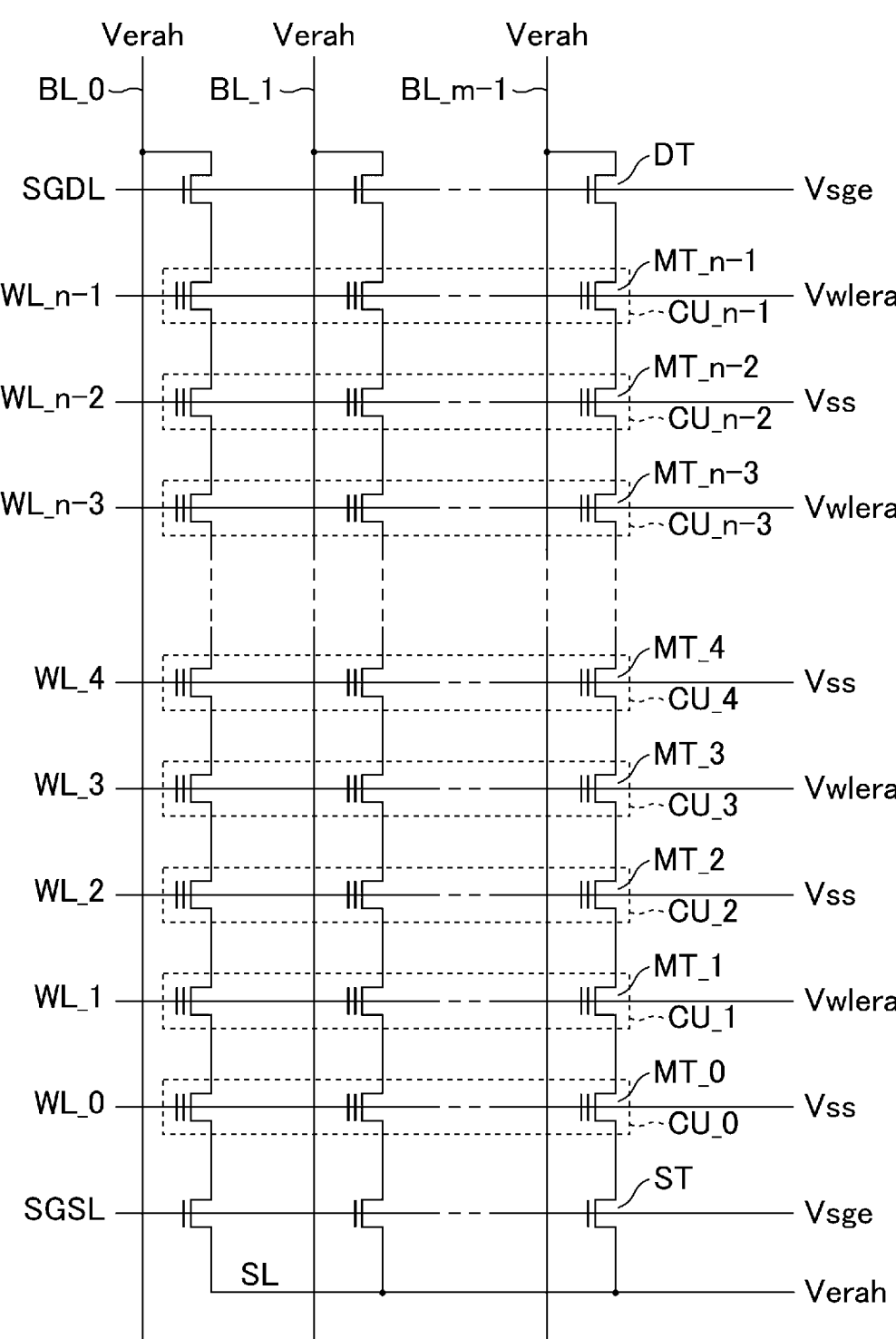
FIG. 14 is a diagram illustrating one state during the data erasing in the storage device according to Modified Example 1 of the first embodiment.
Figure 15:
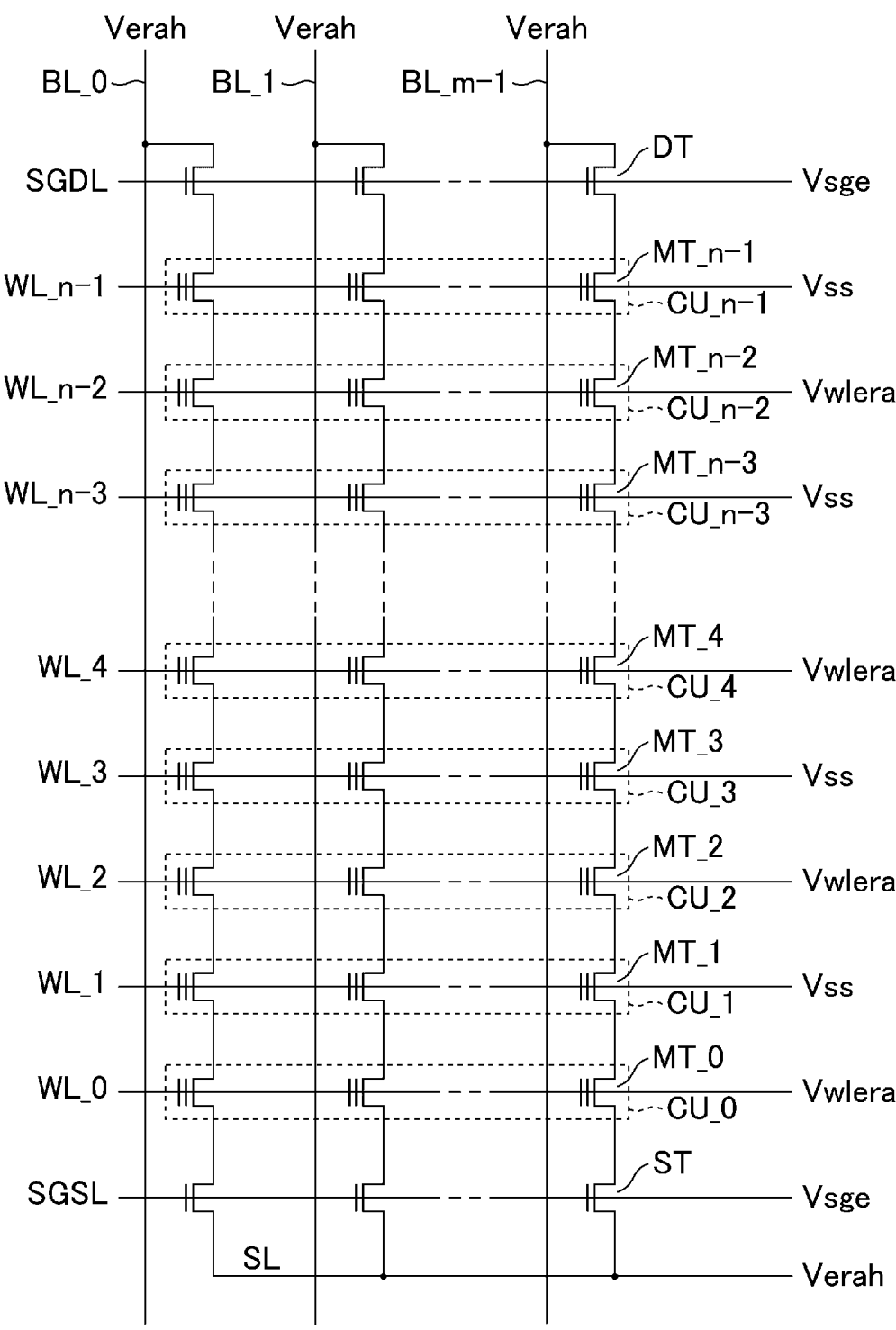
FIG. 15 is a diagram illustrating one state during the data erasing in the storage device according to Modified Example 1 of the first embodiment.
Figure 16:
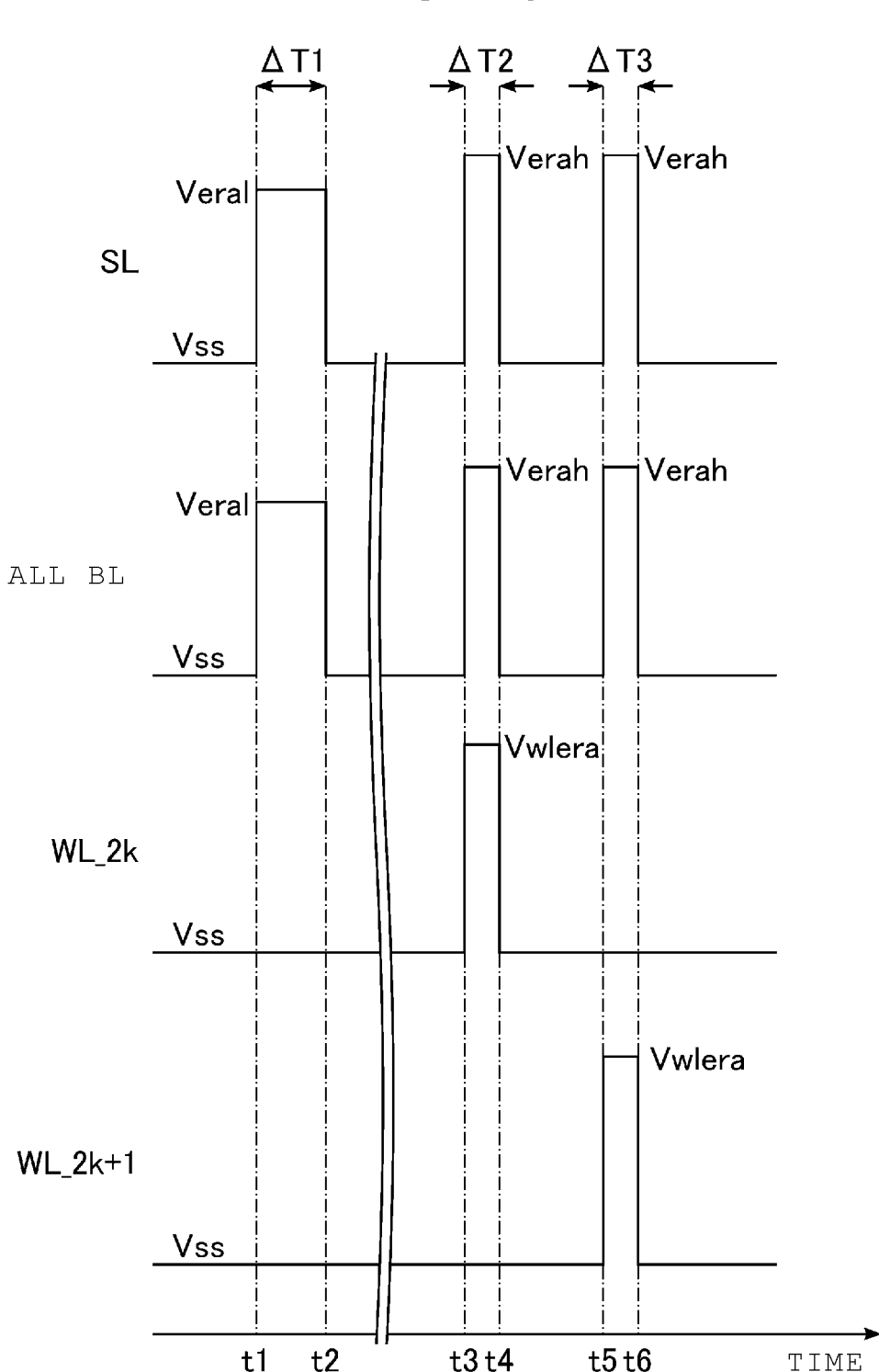
FIG. 16 is a diagram illustrating waveforms of voltages applied to source lines during the data erasing in the storage device according to Modified Example 1 of the first embodiment.

In order to generate the GIDL current in the select gate transistor DT during the data erasing, as illustrated in FIGS. 13 to 16, the high erase voltage Verah or the low erase voltage Veral is applied to each bit line BL by the voltage generation circuit 14. FIGS. 13 to 15 illustrate one state during the data erasing in the storage device 1 of Modified Example 1 of the first embodiment. FIG. 16 illustrates waveforms of voltages on wirings during certain operations of the storage device according to the first embodiment. FIGS. 13 to 16 illustrate an example in which the GIDL current is generated in both the select gate transistors DT and ST.

FIG. 13 is similar to FIG. 8 and illustrates the voltages applied to the wirings during the all-cell unit data erasing of the selected block BLKs. As illustrated in FIG. 13, in addition to the select gate line SGSL, the select gate line SGDL also continues to receive the select voltage Vsge. In addition to the source line SL, all the bit lines BL also continue to receive the low erase voltage Veral.

FIG. 14 is similar to FIG. 9 and illustrates voltages applied to wirings during the first group cell unit data erasing of the selected block BLKs. As illustrated in FIG. 14, in addition to the select gate line SGSL, the select gate line SGDL also continues to receive the select voltage Vsge. In addition to the source line SL, all the bit lines BL also continue to receive the high erase voltage Verah.

FIG. 15 is similar to FIG. 10 and illustrates voltages applied to wirings during the second group cell unit data erasing of the selected block BLKs. As illustrated in FIG. 16, in addition to the select gate line SGSL, the select gate line SGDL also continues to receive the select voltage Vsge. In addition to the source line SL, all the bit lines BL also continue to receive the high erase voltage Verah.

FIG. 16 illustrates, over time, waveforms of voltages applied to the source lines during the data erasing in the storage device 1 of Modified Example 1 of the first embodiment, and thus, FIG. 16 is similar to FIG. 11. As illustrated in FIG. 16, from time t1 to time t2, the low erase voltage Veral is applied to all the bit lines BL of the selected block BLKs. From time t3 to time t4, the high erase voltage Verah is applied to all the bit lines BL of the selected block BLKs. From time t5 to time t6, the high erase voltage Verah is applied to all the bit lines BL of the selected block BLKs. The period in which the voltage is applied to the source line SL and the period in which the voltage is applied to the bit line BL may not necessarily match. At least the states described above with reference to FIGS. 13 to 15 may be generated.

Since the example in which the GIDL current is generated only by the select gate transistor DT can be analogized from the description made with reference to FIG. 11 and the description made with reference to FIG. 16, the description is omitted.

Figure 17:
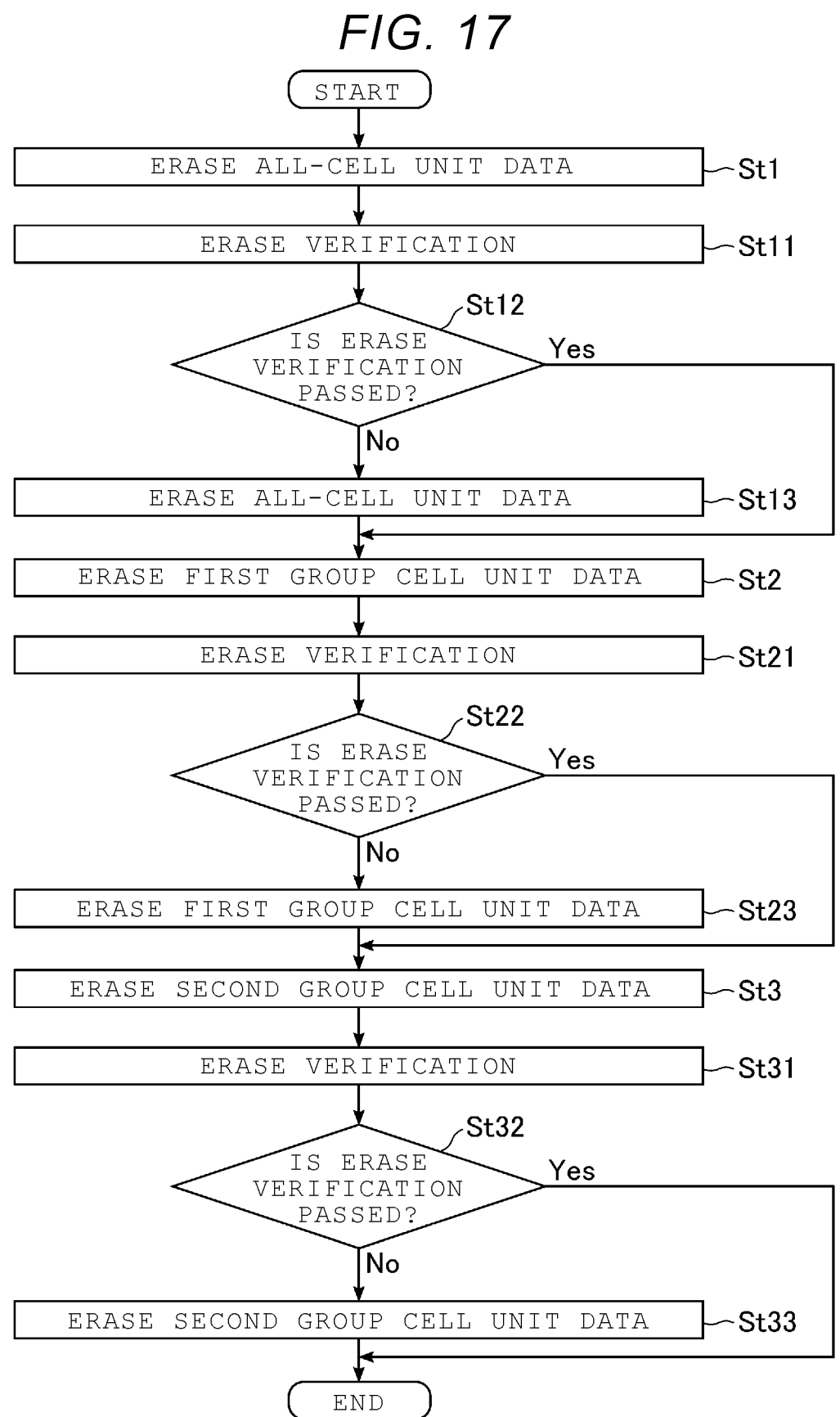
FIG. 17 is a diagram illustrating a flow of data erasing of a storage device according to Modified Example 2 of the first embodiment.

As described above with reference to FIGS. 8 to 10, the data erasing may include erase verification and/or the second loop. Furthermore, one or more of the all-cell unit data erasing, the first group cell unit data erasing, and the second group cell unit data erasing may be performed two or more times. FIG. 17 illustrates the example thereof and illustrates the flow of the data erasing in the storage device 1 of Modified Example 2 of the first embodiment.

As illustrated in FIG. 17, after step St1, the sequencer 13 performs erase verification (St11). The erase verification can be performed on any standard. For example, by applying the erase verification voltage to all the word lines WL, it is determined whether or not one or a plurality of NAND strings are electrically connected (whether all the memory cell transistors MT in the NAND string are turned on).

When the erase verification fails (St12 No), the sequencer 13 performs the all-cell unit data erasing (St13). Step St13 is the same as step St1. The low erase voltage Veral in step St13 may be the same as the low erase voltage Veral in step St1, or may be by ΔVv1 higher than the low erase voltage Veral in step St1. ΔVv1 can have a magnitude determined based on the result of the erase verification in step Stn. Step St13 continues to step St2. When the erase verification is passed (St12 Yes), the flow proceeds to step St2.

After step St2, the sequencer 13 performs the erase verification (St21). The erase verification can be performed based on any standard, like the erase verification in step St12. For example, the erase verification voltage in step St21 is lower than the erase verification voltage in step Stn.

When the erase verification fails (St22 No), the sequencer 13 performs the first group cell unit data erasing (St23). Step St23 is the same as step St2. The high erase voltage Verah in step St23 may be the same as the high erase voltage Verah in step St2, or may be by AVv2 higher than the high erase voltage Verah in step St2. AVv2 can have a magnitude determined based on the result of the erase verification in step St21. When the voltage Vwlera in step St23 is by AVv2 higher than the high erase voltage Verah in step St2, the voltage Vwlera in step St23 may be by AVv2 higher than the voltage Vwlera in step St2. Step St23 continues to step St3. When the erase verification is passed (St22 Yes), the flow proceeds to step St3.

After step St3, the sequencer 13 performs the erase verification (St31). The erase verification can be performed based on any standard, like the erase verification in step St12. For example, the erase verification voltage in step St31 is lower than the erase verification voltage in step Stn. The erase verification voltage in step St31 may be the same as or different from the erase verification voltage in step St21.

When the erase verification fails (St32 No), the sequencer 13 performs the second group cell unit data erasing (St33). Step St33 is the same as step St3. The high erase voltage Verah in step St33 may be the same as the high erase voltage Verah in step St3, or may be by AVv3 higher than the high erase voltage Verah in step St3. ΔVv3 can have a magnitude determined based on the result of the erase verification in step St31. When the voltage Vwlera in step St33 is by ΔVv3 higher than the high erase voltage Verah in step St3, the voltage Vwlera in step St33 may be by AVv2 higher than the voltage Vwlera in step St3. ΔVv3 may be the same as or different from ΔVv2. When step St33 ends, or when the erase verification is passed (St32_Yes), the flow of FIG. 17 ends.

Only one or two of the set of steps St11, St12, and St13, the set of steps St21, St22, and St23, and the set of steps St31, St32, and St33 may be performed. Further, as described above with reference to FIG. 7, the second and subsequent erase loops may be performed by using the flow of FIG. 17 as one erase loop.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device comprising:
a first wiring;
a first select transistor connected to the first wiring;
a second select transistor;
a first memory cell transistor and a second memory cell transistor connected in series between the first select transistor and the second select transistor;
a first word line connected to the first memory cell transistor; and
a second word line connected to the second memory cell transistor,
wherein the storage device is configured such that, during a first period in which a first voltage is applied to the first wiring, a second voltage lower than the first voltage is applied in parallel to the first word line and the second word line,
wherein the storage device is configured such that, during a second period in which a third voltage higher than the first voltage is applied to the first wiring, the second voltage is applied to the first word line, and a fourth voltage higher than the second voltage and lower than the third voltage is applied to the second word line,
wherein the storage device is configured such that, during a third period in which the third voltage is applied to the first wiring, the fourth voltage is applied to the first word line, and the second voltage is applied to the second word line, and
wherein the second period and the third period are shorter than the first period.

2. The storage device according to claim 1,
wherein the storage device is configured such that, during the second period, the fourth voltage is applied to the second word line in parallel with the application of the second voltage to the first word line, and
wherein the storage device is configured such that, during the third period, the second voltage is applied to the second word line in parallel with the application of the fourth voltage to the first word line.

3. The storage device according to claim 1,
wherein the second period follows the first period, and
wherein the third period follows the second period.

4. The storage device according to claim 1, wherein the first voltage is 65% or more and 85% or less of the third voltage.

5. The storage device according to claim 1, wherein the fourth voltage is 80% or more and 120% or less of the first voltage.

6. The storage device according to claim 1, further comprising:
a plurality of first memory cell transistors including the first memory cell transistor;
a plurality of second memory cell transistors including the second memory cell transistor;
a plurality of first word lines including the first word lines and each of the plurality of first word lines being connected to one of the plurality of first memory cell transistors; and
a plurality of second word lines including the second word lines and each of the plurality of second word lines being connected to one of the plurality of second memory cell transistors,
wherein the storage device is configured such that, during the first period, the second voltage is applied in parallel to the plurality of first word lines and the plurality of second word lines,
wherein the storage device is configured such that, during the second period, the second voltage is applied to the plurality of first word lines, and the fourth voltage is applied to the plurality of second word lines, and
wherein the storage device is configured such that, during the third period, the fourth voltage is applied to the plurality of first word lines, and the second voltage is applied to the plurality of second word lines.

7. The storage device according to claim 6,
wherein the storage device is configured such that, during the second period, the fourth voltage is applied to the plurality of second word lines in parallel with the application of the second voltage to the plurality of first word lines, and
wherein the storage device is configured such that, during the third period, the second voltage is applied to the plurality of second word lines in parallel with the application of the fourth voltage to the plurality of first word lines.

8. The storage device according to claim 6,
wherein the second period follows the first period, and
wherein the third period follows the second period.

9. The storage device according to claim 6, wherein the second period and the third period are shorter than the first period.

10. The storage device according to claim 6, wherein the first voltage is 65% or more and 85% or less of the third voltage.

11. The storage device according to claim 6, wherein the fourth voltage is 80% or more and 120% or less of the first voltage.

12. The storage device according to claim 6, wherein the plurality of first memory cell transistors and the plurality of second memory cell transistors are connected alternately one by one in series between the first select transistor and the second select transistor.

13. The storage device according to claim 12, wherein the plurality of first word lines and the plurality of second word lines are aligned alternately one by one.

14. The storage device according to claim 1, wherein the storage device includes a NAND memory.

15. The storage device according to claim 1, wherein the storage device includes a memory array.

16. The storage device according to claim 1, further comprising a voltage generation circuit, wherein the first voltage, the second voltage, the third voltage and the fourth voltage are applied based on the voltage generation circuit.

\*　\*　\*　\*　\*